United States Patent
Akita et al.

(10) Patent No.: US 6,600,483 B1
(45) Date of Patent: Jul. 29, 2003

(54) DRIVING CIRCUIT

(75) Inventors: Shinichi Akita, Kamifukuoka (JP);
Tomoyuki Kawano, Kamifukuoka (JP)

(73) Assignee: New Japan Radio, Co., Ltd., Tokyo (JP)

( * ) Notice: Subject to any disclaimer, the term of this patent is extended or adjusted under 35 U.S.C. 154(b) by 180 days.

(21) Appl. No.: 09/651,371

(22) Filed: Aug. 30, 2000

(30) Foreign Application Priority Data

Feb. 25, 2000 (JP) ........................................ 2000-050220

(51) Int. Cl.⁷ ................................................ G09G 5/00
(52) U.S. Cl. ........................ 345/204; 345/50; 345/55; 345/87; 345/92
(58) Field of Search ................................ 345/204–206, 345/242, 50, 55, 87, 92, 20, 89, 77, 94; 327/53, 54, 66; 330/253, 261; 326/68, 80, 81; 323/315, 312, 313

(56) References Cited

U.S. PATENT DOCUMENTS

| | | | | |
|---|---|---|---|---|
| 4,904,953 A | * | 2/1990 | McCormack | 330/253 |
| 4,937,476 A | * | 6/1990 | Bazes | 327/210 |
| 4,937,516 A | * | 6/1990 | Sempel | 323/315 |
| 5,179,731 A | * | 1/1993 | Trankle et al. | 455/291 |
| 5,278,467 A | * | 1/1994 | Nedwek | 327/52 |
| 5,559,416 A | * | 9/1996 | Hrassky | 318/678 |
| 5,623,279 A | * | 4/1997 | Itakura et al. | 307/404 |
| 5,663,915 A | * | 9/1997 | Mobley | 327/53 |
| 5,703,477 A | * | 12/1997 | Punzenberger | 323/313 |
| 5,748,040 A | * | 5/1998 | Leung | 330/253 |

* cited by examiner

*Primary Examiner*—Bipin Shalwala
*Assistant Examiner*—Leonid Shapiro
(74) *Attorney, Agent, or Firm*—Armstrong, Westerman & Hattori, LLP

(57) ABSTRACT

The present invention relates to a driving circuit used suitably for driving a capacitive load such as liquid crystal panel. The driving circuit of the present invention comprises a differential amplifying circuit, an output circuit and current control circuit. The output circuit is driven by an output signal of the differential amplifying circuit. A increased current signal is injected to the current control circuit for applying a positive feedback to increase an operating current of the differential amplifying circuit. A negative feedback for decreasing the increased current signal thus injected is also applied to the aforesaid current control circuit.

6 Claims, 21 Drawing Sheets

DRIVING CIRCUIT

BACKGROUND OF THE INVENTION

The present invention relates to a driving circuit used suitably for driving a capacitive load such as liquid crystal panel.

With respect to liquid crystal panel used in portable telephone or hand-held computer, a tendency of upsizing the same is promoted simultaneously with that of reduction in electric power consumption of the same year by year. In this respect, an equivalent capacity of a liquid crystal panel to be covered by a single driving circuit corresponds to a total capacity of a plurality of liquid crystal cells on a single common line or a single segment line. Such equivalent capacity depends upon an area of its panel, so that a value thereof reaches several thousand pF to several ten thousand pF, besides upsizing of liquid crystal panel advances year after year, and thus the equivalent capacity increases much more.

First of all, a first conventional example will be described hereunder. FIG. 12 is a circuit diagram showing an archaic conventional driving circuit 100 which is arranged in such that the maximum value of a load to be driven is predetermined, whereby an operating current has been set in its design stage wherein reference characters MP101 to MP105 designate PMOS transistors, and MN101 to MN103 NMOS transistors, respectively. It is to be noted that a back gate of a PMOS transistor is connected to a high potential power source VDD, while a back gate of an NMOS transistor is connected to a low potential power source VSS, although such arrangement is not specifically explained hereinafter.

Reference numeral 101 designates a differential amplifying circuit composed of MP101, MP102, MP104, MN101, and MN102, 102 a noninverting input terminal, 103 an inverting input terminal, 104 an output circuit composed of MN103, MP105, and a phase compensating capacitor C102, 105 an output terminal, and C101 a capacitive load, respectively. In this arrangement, MP104,and MP105 are connected to MP103 in a current mirror fashion, so that a bias current corresponding to a current source I101 flows through them.

FIG. 13 is a waveform diagram of voltages and electric currents in respective sections of the driving circuit 100 wherein the inverting input terminal 103 is commonly connected to the output terminal 105 to operate the whole arrangement as a voltage follower. In the case shown in FIG. 13, VDD=0 V, VSS=–10 V, the capacitive load C101 is 10,000 pF, and a driving signal Vin (200 $\mu$s cycle, and 50% duty(duty ratio)) is fed to the noninverting input terminal 102. In the figure, time is plotted as abscissa and drain voltage Vd(#) of a transistor #, drain current Id(#) of the transistor #, and current consumption Ivdd flowing through the power source VDD as ordinates, respectively.

A comparatively large current consumption Ivdd is observed for a comparatively long period of time from the time at which the driving signal Vin at the input terminal 102 varies. At least 258.26 $\mu$A was required for the current Ivdd heretofore. Furthermore, the driving circuit 100 is arranged in such that the current of I101 and each size ratio of MP104 and MP105 with respect to MP103 have been previously determined in response to the possible maximum capacity of the capacitive load C101, whereby a bias current flowing through MP104 and MP105 is decided. In this respect, however, since such bias current flows in even a steady state wherein the driving signal Vin does not vary, there is such a problem that the bias current (idling current) is useless, so that its driving efficiency decreases in the case where a small load is driven.

A second conventional example will be described. FIG. 14 is a circuit diagram showing a driving circuit 120 which is obtained by improving the driving circuit 100 shown in FIG. 12 in such that an operating current is increased tentatively for only a timing period where a driving signal Vin varies and which has been proposed by Japanese Unexamined Patent Publication No. 221560/1995. In FIG. 14, reference characters MP121 through MP125 designate PMOS transistors, while MN121 through MN124 NMOS transistors, respectively.

Reference character 121 denotes a differential amplifying circuit composed of MP121, MP122, MP124, MN121, and MN122, 122 a noninverting input terminal, 123 an inverting input terminal, 124 an output circuit composed of MN123, MP125, and a phase compensating capacitor C122, 125 an output terminal, and C121 a capacitive load, respectively. MP124 and MP125 are connected to MP123 in a current mirror fashion. MN124, and resistors R121 and R122 constitute a bias switching circuit 126. Reference numeral 127 designates a control terminal.

In the driving circuit 120 shown in FIG. 14, the inverting input terminal 123 is commonly connected with the output terminal 125, so that the whole arrangement operates as a voltage follower. In the arrangement, a voltage with "Hi" level is applied to the control terminal 127 in exact timing with a transition of the driving signal Vin by its corresponding term to bring MN124 into conduction, so that R122 is short-circuited, whereby an operating current flowing through MP124 and MP125 is increased to supply a driving current requested by the capacitive load C121. Accordingly, an operating current in the case where it is not required for driving operation decreases and its driving efficiency is remarkably improved as compared with the driving circuit 100 shown in FIG. 12.

However, although the driving circuit 120 can cope with a load which has been predetermined beforehand, its operating current can be switched only in two stages, so that there is such a problem that a driving force becomes insufficient with respect to a larger load than that forecasted, and on the contrary, a useless current flows with respect to a smaller load than that which has been forecasted. Moreover, when a frequency of a driving pulse becomes high, a rate of time occupied by a term wherein a current is allowed to increase builds up also so that an effect for saving electric current decreases. In addition, since electric current available efficiency itself for a driving period of time is not different from that of the circuit shown in FIG. 12, an electric current increases when its load capacity increases.

A third conventional example will be described. FIG. 15 is a circuit diagram showing a driving circuit 140 wherein a voltage change in a differential circuit is converted into current change to increase its output driving force. The driving circuit 140 is called also by the name of "transconductance amplifier" and which is known from long ago. In FIG. 15, reference characters MP141 to MP146 designate PMOS transistors, and MN141 to MN144 NMOS transistors, respectively.

Reference numeral 141 denotes a differential amplifying circuit composed of MP141, MP142, MP145, MN141, and MN142, 142 a noninverting input terminal, 143 an inverting input terminal, 144 an output circuit composed of MP146 and MN 143, 145 an output terminal, and C141 a capacitive load, respectively. MN144 and MP144 are served for supplying a drain voltage change in MN141 to MP146. To MN143 is supplied a drain voltage in MN142. A bias current corresponding to an electric current of a current source I141 is flowing through MP145 by means of MP143.

FIG. 16 is a waveform diagram of voltages and electric currents in respective sections of the driving circuit 140 wherein the inverting input terminal 143 is commonly connected with the output terminal 145 to operate the whole arrangement as a voltage follower. In the case shown in FIG. 16, VDD=0 V, VSS=−10 V, the capacitive load C141 is 10,000 pF and a driving signal Vin (200 $\mu$s cycle, and 50% duty) is fed to the noninverting input terminal 142. In the figure, time is plotted as abscissa and drain voltage Vd(#) of a transistor #, drain current Id(#) of the transistor #, and current consumption Ivdd flowing through the power source VDD as ordinates, respectively. The Ivdd was 228.18 $\mu$A in its steady state. It is to be noted that as to a waveform the polarity of which has been inverted in FIG. 16, "−" (bar) is applied over a symbol of the corresponding voltage or electric current.

In the driving circuit 140, a drain of MN141 is connected directly with a gate of MN144, while a drain of MN141 is connected electrically to MP146 through MN144 and MP144. Accordingly, an operating current of MN142 determines that of MN 143, and an operating current of MN141 determines that of MP146. Hence, when a size ratio of MN142 to MN143 as well as a size ratio of MN141 to MP146 are made remarkable, a large capacitive load C141 can be driven. However, such arrangement as described above brings about a problem of an increase of idling current in MN143 and MN146. Furthermore, an idling current in the differential amplifying circuit 141 must be flowing all the time and cannot be reduced.

A forth conventional example will be described. FIG. 17 is a circuit diagram showing a driving circuit 160 which is arranged in such that a change in voltage output of a differential amplifying circuit is converted into electric current, and to which is applied positive feedback to increase a drivability. This arrangement is called by the name of adaptive bias system and which has been proposed by Japanese Unexamined Patent Publication Nos. 104663/1994, 22741/1998 and U.S. Pat. No. 5,471,171 etc. In FIG. 17, reference numerals MP161 through MP167 designate PMOS transistors, and MN161 through MN164 NMOS transistors, respectively.

Reference character 161 denotes a differential amplifying circuit composed of MP161, MP162, MP166, MN161, and MN162, 162 a noninverting input terminal, 163 an inverting input terminal, 164 an output circuit composed of MN164, MP167, and a phase compensating capacitor C162, 165 an output terminal, and C161 a capacitive load, respectively. MP165 through MP167 are connected with MP164 in a current mirror fashion, and through which a bias current corresponding to a value of electric current obtained by summing up those flowing through a current source I161 and MP163 is flowing, respectively. MN163 is used for detection in accordance with such a manner that a drain voltage of MN161 is detected to amplify the same, and the resulting voltage is delivered to MP163.

FIG. 18 is a waveform diagram of voltages and electric currents in respective sections of the driving circuit 160 wherein the inverting input terminal 163 is commonly connected with the output terminal 165 to operate the whole arrangement as a voltage follower. In the case shown in FIG. 18, VDD=0 V, VSS=−10 V, the capacitive load C161 is 10,000 pF, and a driving signal Vin (200 $\mu$s cycle, and 50% duty) is inputted to the noninverting input terminal 162. In the figure, time is plotted as abscissa and drain voltage Vd(#) of a transistor #, drain current Id(#) of the transistor #, and current consumption Ivdd flowing through the power source VDD as ordinates, respectively. The Ivdd decreased to a value of 67.87 $\mu$A at the time of equilibrium. It is to be noted that as to a waveform the polarity of which has been inverted in FIG. 18, "−"(bar) is applied over a symbol of the corresponding voltage or electric current.

In the driving circuit 160 when applied for a voltage follower, a step input signal to Vin or a modification of capacitive load C161 causes voltage transition at the output node which is detected and amplified with MN163 to reflect into the drain current of MP163, and the drivability is controlled through the bias current modulation of MP166 and MP167. For instance, when the driving signal input Vin rises, until the output voltage Vout reaches to the same level as of Vin, the drain voltage of MP161 keeps rising that is detected with MP163 to lower its drain voltage and then the drain currents of MP163, MP166 and MP167 are boosted. Namely the output modulation is fed back positively to MP166 and MP167.

Operating currents of MP166 and MP167 in this case are determined by the maximum load current and a current amplification factor in case of positive feedback. In this connection, if the capacitive load C161 is 10,000 pF, 10 mA of electric current is required in the case where the capacitive load C161 is charged to 10V in 10 $\mu$s. The current amplification factor in this case is determined by a size ratio of MP164 and MP167. If a current magnification is 100, and when a size ratio of MP164 is set to a value of W/L=40 $\mu$m/20 $\mu$m=2, it may be set a size ratio of MP167 in such that W/L=600 $\mu$m/3 $\mu$m=200. An electric current of MP164 in this case is $\frac{1}{100}$ of 10 mA, so that it becomes 100 $\mu$A. When a current amplification factor is made 1000 times larger, a size ratio of MP167 becomes W/L=6000 $\mu$m/3 $\mu$m=2000, so that it brings about a considerably large transistor. With respect to stability thereof, there is no problem wherein MN163 is operated in class "B" or class "C" manner so as not to be substantially applied positive feedback in an equilibrium state of the differential amplifying circuit 161.

However, it is theoretically possible to operate the driving circuit 160 stably if an amount of positive feedback is made optimum in a state where positive feedback functions, but open loop gains of MN163 and MP163 become high, so that difficulties are accompanied with a design for maintaining its stability. On the other hand, when open loop gains of MN163 and MP163 are made small, a sufficient positive feedback operation is not carried out. More specifically, there was such a problem that it became critical to set gains of MN163 and MP163. Moreover, when operating points of amplifying operation by means of MN163 and MP163 come near power source voltages, its amplifying circuit itself does not operate normally. Thus, there was also such a problem that it became difficult to solve a pseudo-parasitic oscillating trouble.

A fifth conventional example will be described. FIG. 19 is a circuit diagram showing another conventional driving circuit 180 wherein an output voltage is converted into the form of electric current thereby to drive a load and which has been proposed by IEEE, JSSC, JUNE 1986, "An Efficient CMOS Buffer for Driving Large Capacitive Loads". In FIG. 19, reference numerals MP181 to MP187 designate PMOS transistors, MN181 to MN187 NMOS transistors, respectively.

Reference numeral 181 denotes a differential amplifying circuit composed of MP182, MP183, and MN181 through MN183, 182 a noninverting input terminal, 183 an inverting input terminal, 184 an output circuit composed of MN187 and MP187, 185 an output terminal, C181 a capacitive load, and 186 an output driving circuit composed of MP184 to MP186, MN185, and MN186, respectively. A drain of MP183 is directly connected with a gate of MP184, while a drain of MP182 is connected with a gate of MN185 through MP181 and MN184.

In the driving circuit 180 shown in FIG. 19, the inverting input terminal 183 is commonly connected with the output terminal 185, and the whole arrangement thereof functions as a voltage follower. A bias voltage VB181 is applied to a gate of MP186, a bias voltage VB182 is applied to a gate of MN186, and a bias voltage VB183 is applied to a gate of MN183, and there is a relationship of VB181<VB182<VB183.

The driving circuit 180 is basically a modification of the transconductance amplifier shown in FIG. 15 wherein an electric current corresponding to a drain current of MN182 is reflected to MP184, while an electric current corresponding to a drain current of MN181 is reflected to MN185. This circuit is arranged in such that an output circuit 184 can be fully swung by means of an output driving circuit 186 wherein MP185 functions as a resistance element, whereby a gate voltage of MP187 has a prescribed voltage difference with respect to a gate voltage of MN187, so that simultaneous conduction of both MP187 and MN187 is prevented. Furthermore, MP186 and MN186 are served for affording a gate bias to MP187 and MN187, whereby the latters can effect correct class "B" operation.

In also the driving circuit 180, there is such a problem that when a remarkable idling current is not supplied to MP187 and MN187 on the output side, a stable operating point cannot be obtained, although a significant driving force is attained. Besides, there is also such problem that the idling current in the output driving circuit 186 becomes remarkable.

A sixth conventional example will be described. FIG. 20 is a circuit diagram showing a driving circuit 200 wherein two differential amplifying circuits being similar to each other are provided, and one of which is served for a sensor for sensing input signals or changes in output, whereby a driving force of the other differential amplifying circuit or an output circuit is adaptively controlled. Such driving circuit has been proposed by IEEE, JSSC, JUNE 1998, "A Very-High-Slew-Rate CMOS Operational Amplifier" and Japanese Unexamined Patent Publication No. 136044/1999. In FIG. 20, reference characters MP201 through MP207 denote PMOS transistors, and MN201 through MN209 NMOS transistors, respectively.

Reference numeral 201 designates a main differential amplifying circuit composed of MP205, MP206, and MN206 to MN208, 202 a noninverting input terminal, 203 an inverting input terminal, 204 an output circuit composed of MP207 and MN209, 205 an output terminal, C201 a capacitive load, 206 a subsidiary differential amplifying circuit composed of MP201 to MP203, MN201, and MN202, and 207 a bias circuit composed of MN203 and MN204 and which is used for the main differential amplifying circuit 201, respectively. A drain of MP206 is directly connected with a gate of MP207, while a drain of MP205 is connected with a gate of MN209 through MP204 and MN205. In other words, the main differential amplifying circuit 201 and the output circuit 204 constitute a transconductance amplifier.

The driving circuit 200 is arranged in such that an electric current of MP201 in the subsidiary differential amplifying circuit 206 is set to be low to keep MN203 and MN204 "Off" in equilibrium state, whereby MN203 and MN204 operate in class "B" or "C" manner. These MN203 and MN204 operate at different operating points one another to detect and amplify a voltage corresponding to a potential difference of differential output of the subsidiary differential amplifying circuit 206, whereby an operating current of the main differential amplifying circuit 201 is increased. In the case when the subsidiary differential amplifying circuit 206 is in the equilibrium state, electric current does not flow through MN203 and MN204, so that the electric current only flows during the positive feedback operation and no useless current flows.

In the driving circuit 200, however, since two differential amplifying circuits are employed, there is a problem of an increase in current consumption. Furthermore, because the main differential amplifying circuit 201 and the output circuit 204 constitute a transconductance amplifier, there is such a problem that a significant idling current must be flowed in the case where a load having a large capacity, as in the above described driving circuits 140 and 180 shown in FIGS. 15 and 19.

A seventh conventional example will be described. FIG. 21 is a circuit diagram showing a driving circuit 220 arranged in such that a current change in a driving waveform is amplified or divided to apply positive feedback thereto, thereby elevating a driving force. Such driving circuit has been proposed by IEEE, JSSC, JUNE, 1990 "Class AB CMOS Amplifires with High Efficiency". In FIG. 21, reference characters MP221 to MP228 designate PMOS transistors, and MN221 to MN228 NMOS transistors, and I221 to I224 current sources, respectively.

Reference numeral 221 denotes a first differential amplifying circuit composed of MP221, MP222, MN221 through MN223, and the current source I221, 222 a noninverting input terminal, 223 an inverting input terminal, 224 an output circuit composed of MP228 and MN228, 225 an output terminal, C221 a capacitive load, and 226 a second differential amplifying circuit composed of MP226, MP227, MN226, MN227, and I224, respectively.

When an input voltage Vin decreases, a control circuit 227 accompanied with the above described first amplifying circuit 221 and composed of MN223, MN224, MP223, and I222 is allowed to increase an electric current of MN223 to apply positive feedback to the first differential amplifying circuit 221, and at the same time, it is allowed to increase an electric current of MN228 in the output circuit 224. On one hand, when the input voltage Vin increases, a control circuit 228 accompanied with the above described second amplifying circuit 226 and composed of MP224, MP225, MN225, and I223 is allowed to increase an electric current of MP225 to apply positive feedback to the second differential amplifying circuit 226, and at the same time, it is allowed to increase an electric current of MP228 in the output circuit 224.

In the driving circuit 220, positive feedback is applied to an operating current of the first differential amplifying circuit 221 in the case when the input voltage Vin decreases, while positive feedback is applied to an operating current of the second differential amplifying circuit 226 in the case when the input voltage Vin increases. In either of the above cases, the output circuit 224 is remarkably driven, so that its driving force is elevated. An amount of positive feedback applied to the first differential amplifying circuit 221 is determined by a size ratio of MN224 and MN223, while an amount of feedback applied to the second differential amplifying circuit 226 is determined by a size ratio of MP224 and MP225.

In the driving circuit 220, however, since two differential amplifying circuits are used, its consumption current increases. Besides, since MN228 in the output circuit 224 is driven by MN224 and MP228 in the output circuit 224 is driven by MP224, operation of MP228 and that of MN228 in the output circuit 224 become off-balance and unstable, if the feed back operation accomplished with the control circuit 227 and that accomplished with the control circuit 228 do not coincide completely with each other.

Because of this reason, at least several tens $\mu$A of idling current is needed in the case where a load having a large capacity is driven in order to achieve a stable operation. When a magnification of positive feedback (a size ratio of MN223 with respect to MN224, and a size ratio of MP225 with respect to MP224) is allowed to increase, it is possible to reduce a magnification of the output transistors MP228 and MN228 (a size ratio of MN228 with respect to MN224, and a size ratio of MP228 with respect to MP224). However, a magnification of positive feedback is self-limited, and there is a limitation in reduction of consumption current. As appeared in page 525 of the above described literary document, when a capacity of the capacitive load C221 is 470 pF or more, performance of 0.25 V/$\mu$s slew rate, and 15 times higher current ratio (page 526 of the above described literature) can be attained, but much more improvement is required for driving a liquid crystal panel of 10,000 pF or higher.

As described above, a conventional driving circuit involves a problem of increasing current consumption as a result of useless idling, a problem of a difficulty in handling load variation in a driving circuit wherein an operating current is switched in two steps, and a problem of a difficulty in a design for stable operation in a driving circuit wherein an operating current is varied in response to an input voltage.

An object of the present invention is to provide a driving circuit by which the above described problems can be eliminated.

SUMMARY OF THE INVENTION

To solve the above described problem, a driving circuit of the present invention comprises a differential amplifying circuit, an output circuit driven by an output signal of the differential amplifying circuit, and a current control circuit for applying a positive feedback in such that an increased current signal of an operating current on a noninverting side or an operating current on an inverting side of the differential amplifying circuit is injected to increase an operating current of the differential amplifying circuit, wherein a negative feedback for decreasing the increased current signal thus injected is applied to the aforesaid current control circuit.

Furthermore, the aforesaid differential amplifying circuit may comprise a first current mirror circuit for supplying an electric current corresponding to an operating current on the noninverting side to an output section on the inverting side, and a second current mirror circuit for supplying an electric current corresponding to an operating current on the inverting side to an output section on the noninverting side, wherein an increased variation signal of either of the electric current supplied by the first current mirror circuit or the electric current supplied by the second current mirror circuit is injected to the aforesaid current control circuit as the aforesaid increased current signal.

Moreover, the driving circuit of the present invention may comprise a biasing current mirror circuit to add a current being proportional to the aforesaid increased current signal to the operating current of the aforesaid differential amplifying circuit, and a group of negative feedback current mirror circuits which is allowed to decrease the aforesaid increased current signal injected to the current control circuit with the lapse of time are provided.

The aforesaid current control circuit may be provided with a delay capacitor charged by the aforesaid increased current signal thus injected.

Furthermore, the aforesaid biasing current mirror circuit may also be provided with a delay capacitor charged by the aforesaid increased current signal thus injected.

The aforesaid group of the negative feedback current mirror circuits may comprise a first current mirror circuit wherein the aforesaid increased current signal is injected to an output side thereof, a second current mirror circuit wherein an electric current on the output side of the first current mirror circuit flows in an reference side thereof, while an electric current on its output side flows in the reference side of the aforesaid first current mirror circuit and a third current mirror circuit wherein an electric current on the reference side of the aforesaid first current mirror circuit flows in its reference side, while an electric current on its output side flows in the output side of the aforesaid first current mirror circuit, and each magnification of the aforesaid first, second, and third current mirror circuits is set to a predetermined value, whereby the aforesaid increased current signal thus injected is allowed to decrease.

The aforesaid output circuit may be constituted in such that a first transistor driven in response to an increased current signal of either of the operating current on the noninverting side or the operating current on the inverting side of the aforesaid differential amplifying circuit and a second transistor driven by a fixed bias voltage are connected serially between a high potential power source and a low potential power source, common connecting points of both the transistors are served for an output terminal, and a third transistor is connected in parallel to the aforesaid second transistor; and the current control circuit to which is injected the other increased current signal of the operating current on the noninverting side or the operating current on the inverting side of the aforesaid differential amplifying circuit is provided with a load resistance for converting the aforesaid increased current signal thus injected into a voltage; whereby the aforesaid third transistor is driven by voltage produced in the load resistance.

DETAILED DESCRIPTION

Figure 1A:
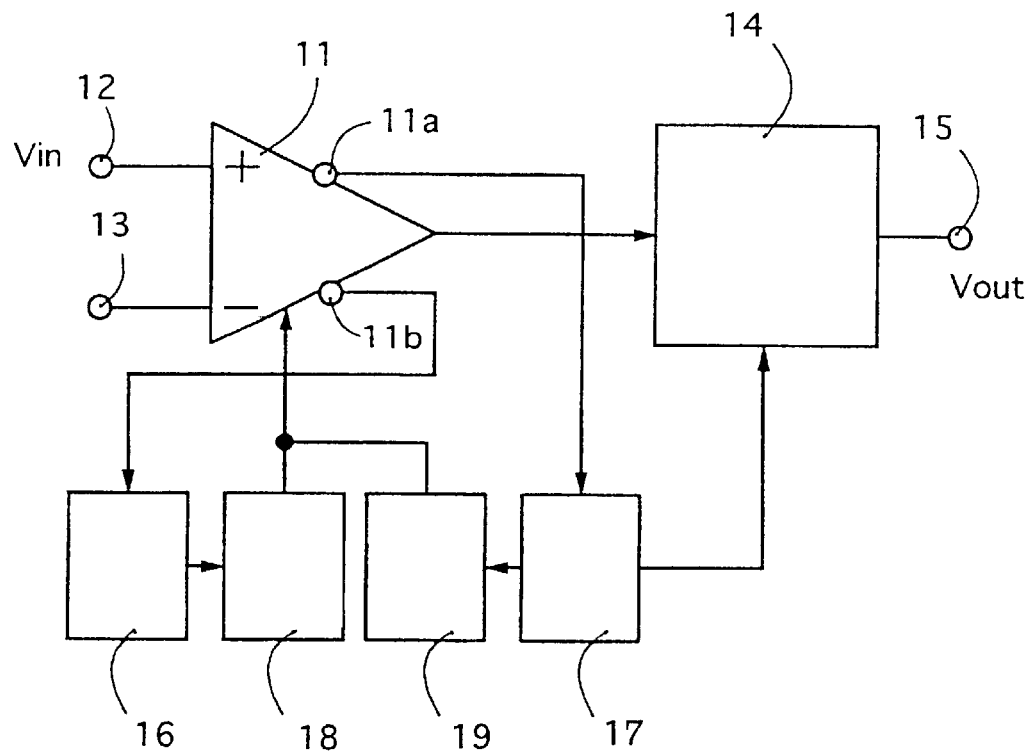
FIGS. 1(a) and 1(b) are block diagrams for explaining a principle of a driving circuit according to the present invention, respectively.

FIG. 1(*a*) is a block diagram showing a driving circuit for explaining a principle of the present invention wherein reference numeral 11 designates a differential amplifying circuit for amplifying a finite difference between voltage signals applied to a noninverting input terminal 12 and an inverting input terminal 13, respectively, 14 denotes an output circuit for inputting an output voltage of the differential amplifying circuit 11, and a load is connected to an output terminal 15 of the output circuit 14. Reference numeral 16 designates a current control circuit to which is injected an increased current signal on the noninverting side of the differential amplifying circuit 11 through a terminal 11*b*, 17 denotes another current control circuit to which is injected an increased current signal on the inverting side of the differential amplifying circuit 11 through a terminal 11*a*, and 18 and 19 denote bias circuits for increasing an operating current of the differential amplifying circuit 11 in response to the current control circuits 16 and 17, respectively. Furthermore, the current control circuit 17 is adapted to increase also a bias current in the output circuit 14.

These current control circuits 16 and 17 are arranged in such that an increased current signal in response to a variation in input of the differential amplifying circuit 11 is injected, whereby positive feedback is applied to the differential amplifying circuit 11 to increase its operating current, but the current control circuits 16 and 17 themselves operate in a negative feedback fashion, so that the above described operation of positive feedback is terminated immediately.

Namely, when an input does not change, outputs on the noninverting and the inverting sides of the differential amplifying circuit 11 do not change, so that an increased current signal is scarcely injected to the current control circuits 16 and 17. Accordingly, in such case as described above, no electric current flows into the bias circuits 18 and 19, so that an idling current in the differential amplifying circuit 11 comes to be a small current, while a bias current in the output circuit 14 comes also to be a small current, and thus, an idling current herein is also small, whereby low electric power consumption can be realized.

On the other hand, when an input varies, an output current on the noninverting or the inverting side of the differential amplifying circuit 11 increases, so that its increased current signal is injected to either of the current control circuits 16 and 17. As a result, an electric current in either of the bias circuits 18 and 19 is increased by means of either of the current control circuits 16 and 17 to increase an operating current in the differential amplifying circuit 11, and a differential signal is amplified by a required amount, so that the differential amplifying circuit 11 operates at high speed. On one hand, in the case when an increased current signal is injected to the current control circuit 17, a bias current in the output circuit 14 is controlled by the current control circuit 17 in a direction wherein the bias current increases, so that an electric current for driving a load increases, whereby its operation is stabilized, and at the same time, the resulting operation is performed at high speed. As described above, when the input signal varies, the driving circuit operates stably, and in which a high slew rate can be realized.

FIG. 1(*b*) is a block diagram showing a driving circuit being a modification of that shown in FIG. 1(*a*) wherein reference numeral 51 designates a differential amplifying circuit for amplifying a finite difference of voltage signals to be applied to a noninverting input terminal 52 and an inverting input terminal 53, respectively, 54 designates an output circuit for inputting an output voltage of the differential amplifying circuit 51, and to an output terminal 55 of the output circuit 54 is connected a load. Reference numeral 56 denotes a current control circuit to which is injected an increased current signal on an noninverting side of the differential amplifying circuit 51 through a terminal 51*b*, and 58 denotes a bias circuit for increasing an operating current of the differential amplifying circuit 51 in response to the current control circuit 56.

The driving circuit 54 of FIG. 1(*b*) has a structure which is obtained by removing the current control circuit 17 and the bias circuit 19 from the driving circuit 10 of FIG. 1(*a*) wherein a bias current in the output circuit 54 is not controlled.

EMBODIMENT 1

Figure 1B:
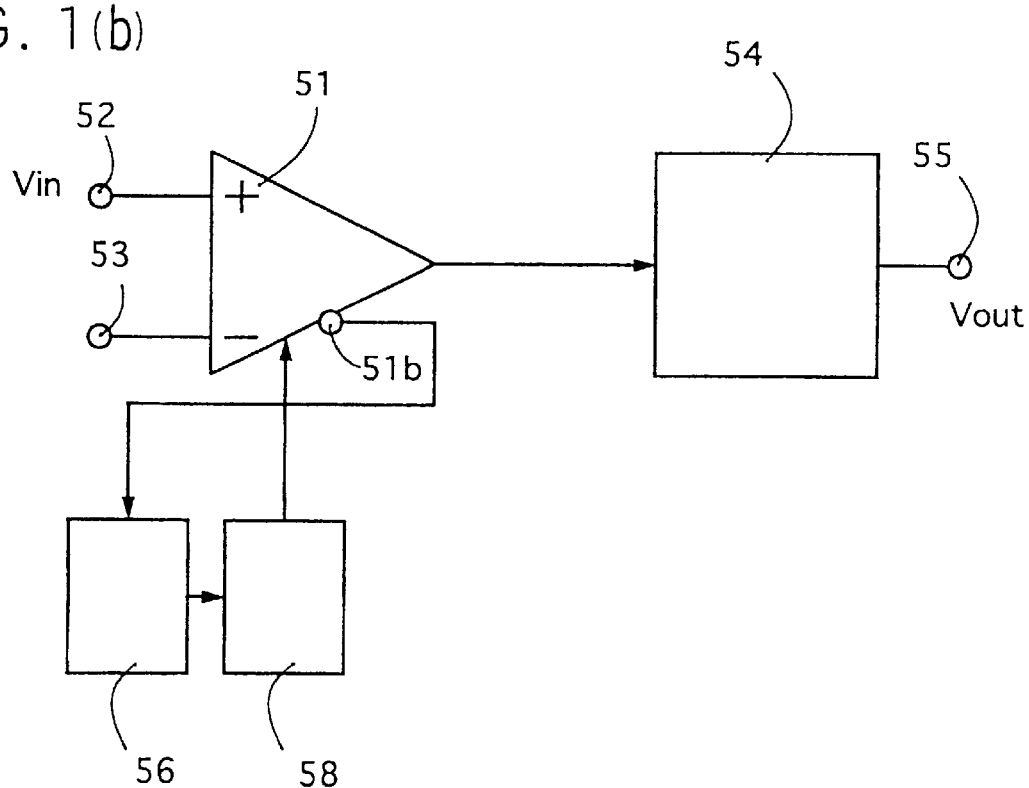
Figure 2:
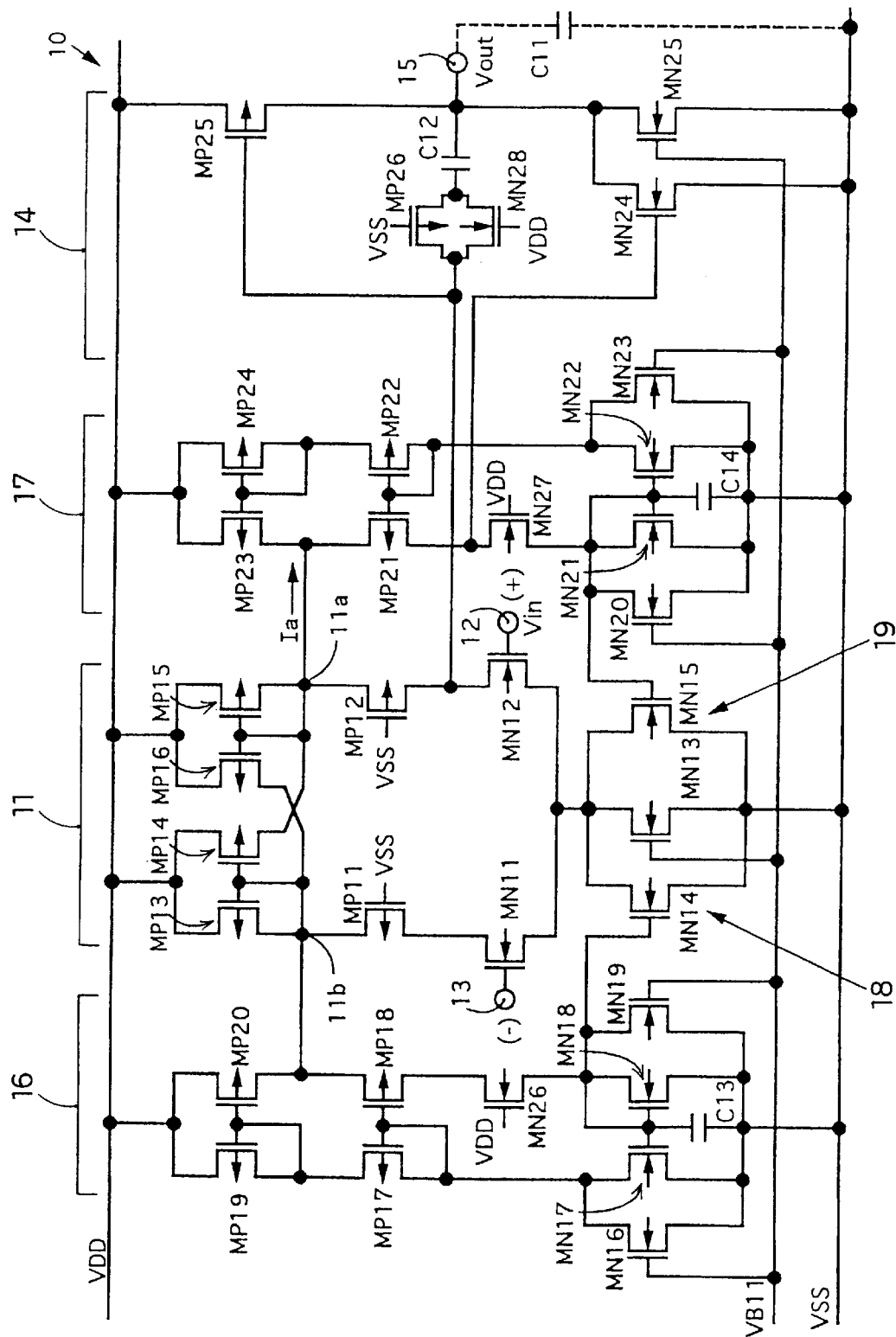
FIG. 2 is a circuit diagram showing a first embodiment of the present invention.

FIG. 2 is a circuit diagram showing the driving circuit 10 according to the first embodiment of the present invention and which corresponds to that of FIG. 1(*a*) wherein the same parts are represented by the same reference characters. In FIG. 2, reference characters MP11 to MP26 denote PMOS transistors, MN11 to MN28 NMOS transistors, C11 a capacitive load, C12 a phase compensating capacitor, and C13 and C14 oscillation preventing capacitors, respectively. To each gate of MN16, MN19, MN13, MN20, MN23, and MN25 is applied a fixed bias voltage VB11.

In the differential amplifying circuit 11, MP12 functions as a load resistance for taking out a voltage to be delivered to the output circuit 14. As a result, a voltage having a large amplitude can be obtained for a drain of MP12 in response to a variation of a drain current in MP12, even if a drain voltage of MP15 is not significantly varied from VDD-Vth (MP15). MP11 is used for keeping a balance with MP12.

In the differential amplifying circuit 11, although the same drain current flows through MN11 and MN12 in its equilibrium state, when the balance comes to be off, for instance, when a drain current of MN11 increases, an electric current corresponding to that flowing through MP13 of a current mirror circuit composed of MP13 and MP14 on the inverting side flows through MP14 in response to a size ratio of MP13 and MP14. However, such current does not flow on the side of MP12 and MN12, and it is injected to the current control circuit 17 as indicated with a symbol "Ia".

On the contrary, when a drain current in MN12 increases, an electric current corresponding to that flowing through MP15 in the current mirror circuit composed of MP15 and MP16 on the noninverting side flows through MP16 in response to a size ratio of MP15 and MP16. However, such electric current does not flow through MP11 and MN11, and it is injected to the current control circuit 16. Furthermore, since a large electric current flows through MP12 in this case, a drain voltage in MP12 decreases remarkably to drive significantly MP25 in the output circuit 14 in spite of such fact that even if the drain voltage of MP15 does not remarkably vary as described above.

In the current control circuit 17, a first current monitor circuit, a second current mirror circuit, and a third current mirror circuit are composed of MP21 and MP22, MN21 and MN22, and MP23 and MP24, respectively. In this constitution, when an electric current is injected to a source of MP21 from the differential amplifying circuit 11, the electric current injected flows through MN21 via MN27. Since the delay capacitor C14 (for example, 0.1 pF) is connected to a gate of MN21, an electric current flowing through MN21 is somewhat delayed. Moreover, since MN21 is connected with MN15 in the bias circuit 19 in a current mirror fashion, MN21 is allowed to flow an electric current to MN15 in response to a size ratio of MN21 and MN15. As a result, the differential amplifying circuit 11 increases an operating current so that positive feedback is applied.

Furthermore, in the case where each size ratio is set to, for example, MN21:MN22=4:1, MP22:MP21=1:1, and MP24:MP23=10:1 in the current control circuit 17, when an electric current is injected to a source of MP21 from the differential amplifying circuit 11, negative feedback having coefficient of 1/40 is applied to MP23 through a path of MP21-MN27-MN21-MN22-MP22-MP24, whereby said negative feedback suppresses the injected current feedback to MP21 after recirculating the transistor chain with a recirculating gain of less than 1, and thus, only a very small amount of electric current flows in its equilibrium state. The first current mirror circuit composed of MP21 and MP23 serves as a current buffer, wherein a current flowing into a source of MP21 is flowing out from its drain, and thus increase its output impedance to obtain large voltage amplitude on a drain of MN27.

As described above, although the current control circuit 17 detects an increasing change in a drain current of MN11 contained in the differential amplifying circuit 11 to apply positive feedback in such that an operating current of the differential amplifying circuit 11 increases, starting of the positive feedback is somewhat delayed by means of the delay capacitor C14, and in addition, the control circuit 17 itself operates in a negative feedback fashion, so that the positive feedback operation is immediately terminated. Accordingly, even if a size ratio of MN21 and MN15 by which an amount of positive feedback is determined is set to around 10, the circuit operates stably.

In the other current control circuit 16, when a drain current of MN12 in the differential amplifying circuit 11 changes increasingly, a drain current of MP16 is injected whereby a positive feedback operation to increase a drain current of MN14 in the bias circuit 18 is carried out. While an operation of the current control circuit 16 is complementary with that of the above described current control circuit 17, the former effects a positive feedback operation by which an operating current of the differential amplifying circuit 11 is increased as well as a negative feedback operation by which the positive feedback operation is terminated for a short period of time in a quite similar fashion to the latter.

In the output circuit 14, MP25 is driven by a drain voltage of MN12 in the differential amplifying circuit 11, and in this case, the drain voltage is adapted in such that it is subjected to voltage conversion by means of MP12 to obtain the same as a large voltage amplitude, so that it can bring out a sufficient driving force. MP26 and MP28 are resistance elements and function together with the capacitor C12 as phase compensating use. MN24 is driven by a drain voltage of MN27 in the current control circuit 17. The MN27 effects the same operation as that of MP12 in the above described differential amplifying circuit 11. More specifically, a change in its drain current is converted into a large voltage amplitude by means of a resistance component of MN27 in spite of the fact that a drain of MN21 in the current control circuit 17 does not significantly deviate from a voltage determined by VSS+Vth (MN21). Hence, when an electric current is injected to the current control circuit 17, MN24 brings out a sufficient driving force to aid an operation of MN25.

Figure 3:
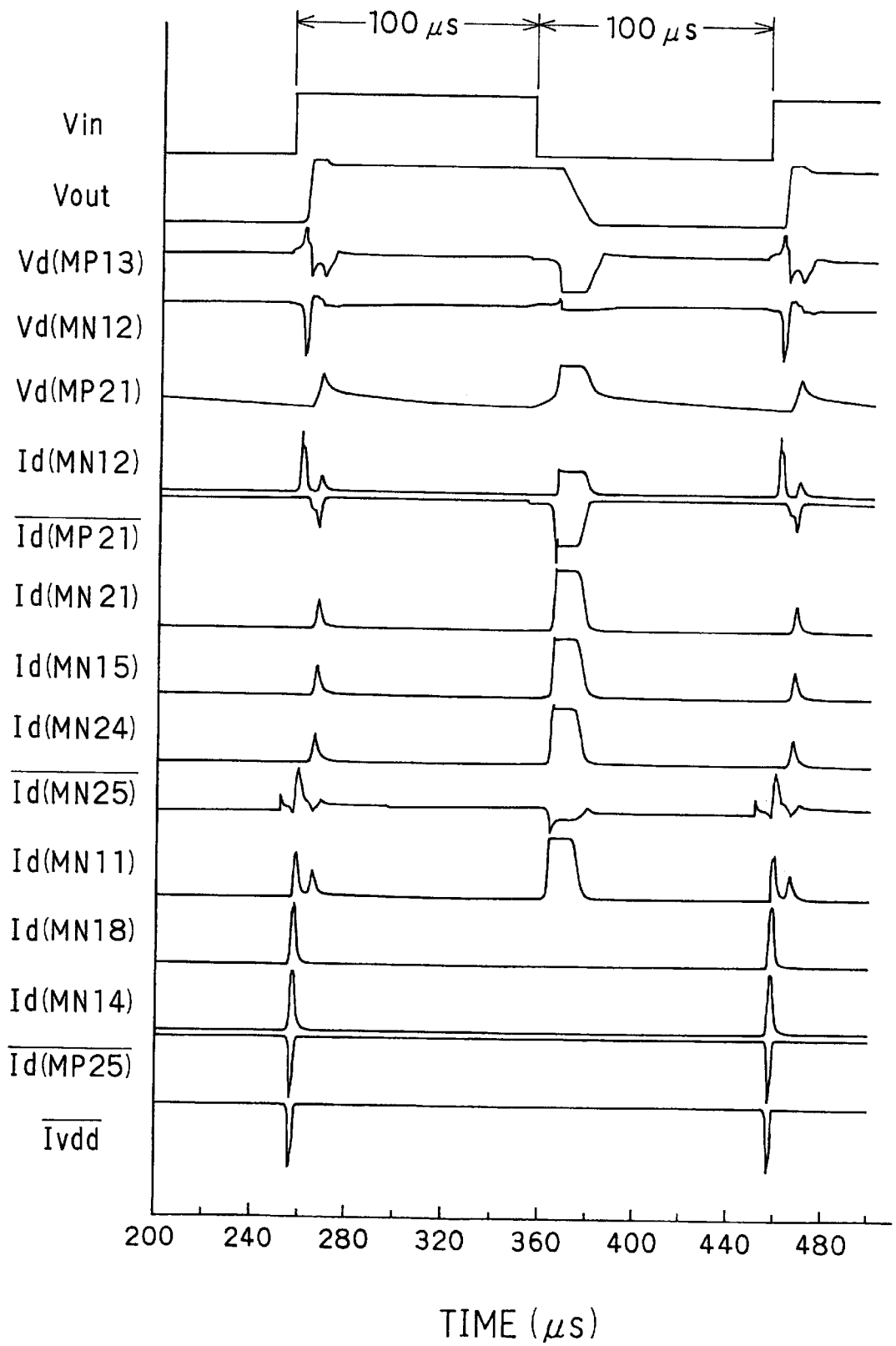
FIG. 3 is a simulation waveform diagram showing currents and voltages in respective sections of the driving circuit 10 shown in FIG. 2.

In the following, operations in the case where an input signal Vin is applied to the noninverting input terminal 12, and the inverting input terminal 13 is commonly connected with the output terminal 15 to form a voltage follower circuit will be described. FIG. 3 is a waveform diagram of voltages and electric currents in respective sections wherein a drain voltage Vd(#)shows that of a transistor #, while a drain current Id(#) shows that of the transistor #. It is to be noted that as to a waveform the polarity of which has been inverted in FIG. 3, "-"(bar) is applied over a symbol of the corresponding voltage or electric current.

First, if a potential of the noninverting input terminal 12 is equal to that of the inverting input terminal 13 in the differential amplifying circuit 11, a slight idling current determined by the bias voltage VB11 flows through MN13 and MN25. In this connection, when it is supposed that a bias current flowing in the bias voltage VB11 is made to be 0.1 $\mu$A at VDD=0 V, and VSS=-10 V, it is possible to flow an electric current of 0.1 $\mu$A through MN13, while an electric current of 0.25 $\mu$A through MN25, besides it is possible to make a total leak current of the other transistors to a value of 0.05 $\mu$A, whereby a stand-by current of the whole driving circuit 10 can be suppressed to around 0.4 $\mu$A, resulting in very low current consumption.

Important herein is to be capable of setting separately idling currents in MN13 and MN25. In this case, the idling current in MN13 may be determined by only the differential amplifying circuit 11, that is, it may be determined by required frequency characteristics and phase characteristics.

On the other hand, an idling current of MN25 is important in view of determining stability in the whole driving circuit 10. Accordingly, although it is better to reduce the idling current from the viewpoint of power consumption, it is required to make a size sufficient in case of driving a load having a large capacity. In this connection, a size W/L=300 $\mu$m/3 $\mu$m is required at the smallest to drive the capacitive load C11 which is supposed to be 10,000 pF within 10 $\mu$s. To suppress an idling current of a transistor having such a large size to, for example, 1 $\mu$A brings about a tendency of an unstable state as a result of a narrowed stable region in the case where the transistor has been connected with other elements. However, MN25 in the present embodiment has not been connected densely with other elements, and an impedance determined by a size of MN25 and MP25 constitute an amplifier of low gain working on a little current, so that there is no factor for making the system unstable. When a size ratio of MP25 is W/L=300 $\mu$m/3 $\mu$m and a size ratio of MN25 is W/L=90 $\mu$m/20 $\mu$m, it has been demonstrated that the driving circuit 10 is stably operated in 0.6 $\mu$A of the idling current of MN25.

Next, when all the potentials in the noninverting input terminal 12, the inverting input terminal 13, and the output terminal 15 are equal to each other, it is called by the name of "stable state". This state corresponds to that wherein there is no disturbance nor input change in a voltage follower circuit obtained by connecting commonly the inverting input terminal 13 with the output terminal 15. In this stable state, when a drain voltage of MP15 in the differential amplifying circuit 11 is equal to a drain voltage of MP23 in the current control circuit 17, no current flows into the current control circuit 17 from the differential amplifying circuit 11. On one hand, when a drain voltage of MP13 is equal to that of MP20 in the current control circuit 16, no current flows also into the current control circuit 16 from the differential amplifying circuit 11. Accordingly, when the same electric current is allowed to flow through a transistor having the same size, such a state can be easily realized. In this respect, even if an equilibrium state come to be somewhat off, it results only in small deviation of its operating point, so that there is no adverse affect with respect to essential stability. For instance, in the case where an idling current of the current control circuit 17 is made to be 1/20 smaller than that of the differential amplifying circuit 11, an equilibrium state can be easily realized by making a size of MP23 in the current control circuit 17 1/20 smaller than a total size of MP14 and MP15 in the differential amplifying circuit 11. This is the same with respect to the other current control circuit 16. Besides, in the current control circuits 16 and 17 of the present embodiment, their operations are hardly affected by their input potentials, if the input potentials (drain voltages of MP 20 and MP23) are held under a certain value.

Figure 4:
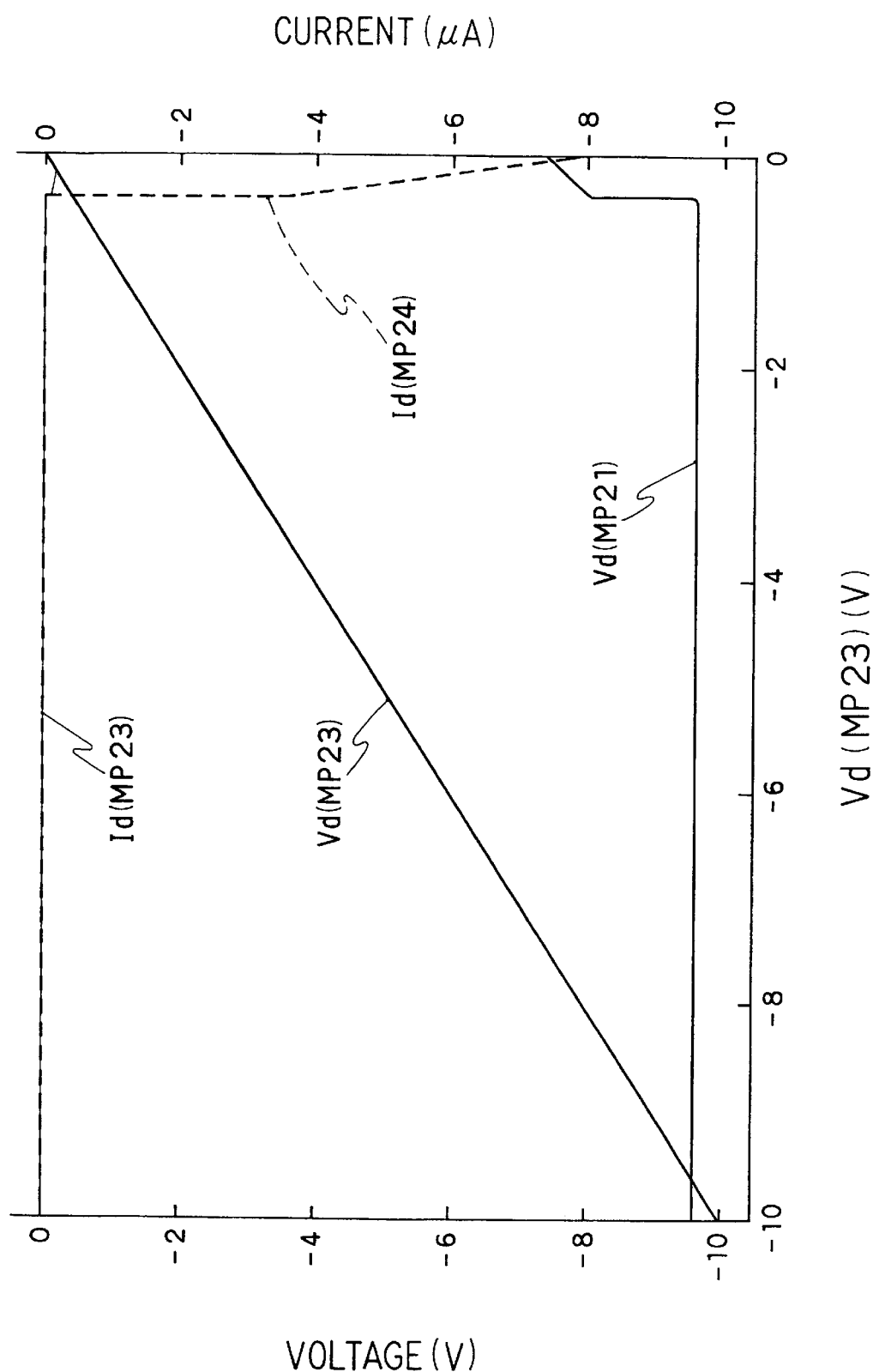
FIG. 4 is a characteristic diagram of a current control circuit 17 contained in the driving circuit 10 shown in FIG. 2 in a steady state.

FIG. 4 is a characteristic diagram for explaining the above described fact and which is obtained by simulating solely the current control circuit 17 wherein VDD=0 V, VSS=–10 V, voltages Vd (MP23) to be applied to a drain of MP23 in the current control circuit 17 are plotted as abscissa and which represent 0 V to –10 V, respectively, and voltages in drain voltage as well as currents in drain current (the polarity of which has been inverted) as ordinate, respectively, wherein drain voltage Vd (#) means a drain voltage of a transistor #, while drain current Id (#) means a drain current of a transistor #.

As is apparent from FIG. 4, a drain voltage Vd(MP21)=–9.56 V in case of Vd(MP23)=–0.422 V, and Vd(MP21)=–9.6 V in case of Vd(MP23)=–8.233 V. When a drain voltage Vd(MP23) varies from 0 V to –0.4 V, a drain current Id(MP23) scarcely flows by –128.06 $\mu$A even at the maximum(in case of Vd(MP23)=–0.244 V). Although a drain current Id(MP24) is –7.8 $\mu$A at the beginning of flow and –3.63 $\mu$A in case of Vd(MP23)=–0.393V, it varies scarcely in a condition of Vd(MP23)=–0.4 or less. For instance, Id(MP23)=–17.93 pA in case of Vd(MP23)=–8.825 V, Id(MP24)=–28.62 pA in case of Vd(MP23)=–0.498 V and Id(MP24)=–22.63 pA in case of Vd(MP23)=–8.815 V, and accordingly, it is scarcely affected by the drain voltage Vd(MP23). As mentioned above, with reference to the current control circuit 17, its internal current varies scarcely within a wide range (–0.4 V to –10 V) of input potential.

This means a fact that the current control circuit 17 is stable in a DC fashion with respect to a wide range of input voltage. Furthermore, although an operating point of the current control circuit 17 (the drain voltage of MP23) can be made substantially identical to a corresponding operating point of the differential amplifying circuit 11 (the drain voltage of MP15) by matching sizes of transistors one another as described above, its operation becomes stable due to the above described negative feedback operation of the current control circuit 17, even if both the operating points deviate substantially from one another.

Next, when a voltage at the noninverting input terminal 12 changes from a low potential to a high potential, the differential amplifying circuit 11 and the current control circuit 16 are principally concerned with the operation of the driving circuit. In this case, since a drain current of MN12 increases and a drain current of MN11 decreases, an electric current in response to an increased drain current of MP15 is injected to a source of MP18 in the current control circuit 16 from MP16, and the electric current flows into MN18 through MP26. As a result, an electric current being proportional to each size ratio of both transistors MN18 and MN14 flows into MN14 connected with MN18 in a current mirror fashion to increase an operating current of the differential amplifying circuit 11. Moreover, as a result of increase in the drain current of MN12 in this occasion, remarkable voltage drop occurs in MP12 to decrease its drain voltage, whereby a gate voltage of MP25 is reduced. For this reason, an output voltage Vout rises.

In this occasion, when an operating current in the differential amplifying circuit 11 increases due to positive feedback, the drain voltage of MN12 lowers much more, so that an electric charge stored in the gate of MP25 is discharged at high speed. Furthermore, as a result of increase in an operating current in the differential amplifying circuit 11 due to positive feedback, an electric current flowing into the current control circuit 16 from the drain of MP16 increases rapidly, but in the current control circuit 16, negative feedback is applied to MP20 from MP18 through MN26, MN18, MN17, MP17 and MP19 as described above, whereby occurrence of an unstable condition as a result of too much increase in electric current is prevented. It has been confirmed by an experiment that the circuit operates stably under a coefficient of this negative feedback (a recirculating gain of the transistor chain) be in a wide range of 0.01 to 0.99.

As mentioned above, when the voltage Vout at the output terminal 15 increases and it becomes equal to a potential at the input terminal 12, the differential amplifying circuit 11 stops its amplifying operation and goes into a stable state, so that an electric current flowing from the differential amplifying circuit 11 into the current control circuit 16 decreases, whereby a stable state is established.

Next, when a voltage at the noninverting input terminal 12 changes from a high potential to a low potential, the differential amplifying circuit 11 and the current control circuit 17 are principally concerned with the operation of the driving circuit. In this case, a drain current in MN11 increases, a drain current in MN12 decreases, and an electric current in response to a drain current in MP13 is injected from the MP14 to a source of MP21 in the current control circuit 17. The drain current of MP21 flows through MN27 and MN21 to increase a drain current in MN15 connected with MN21 in a current mirror fashion, whereby an operating current in the differential amplifying circuit 11 is increased. Furthermore, as a result of increase in the drain voltage in MN12 in this occasion, a gate voltage of MP25 is elevated. Moreover, a drain voltage of MN27 in the current control circuit 17 is significantly elevated by a drain current flowing thereinto, as described above, so that a gate voltage of MN24 is elevated, whereby the output voltage Vout at the output terminal 15 decreases.

In this occasion, when an operating current in the differential amplifying circuit 11 increases due to positive feedback, an electric current flowing from the drain of MP14 into the current control circuit 17 increases rapidly, but negative feedback is applied from MP21 to MP23 through MN27, MN21, MN22, MP22 and MP24, whereby occurrence of an unstable condition as a result of too much increase in electric current is prevented. It has been confirmed by an experiment that the circuit operates stably under a coefficient of this negative feedback (a recirculating gain of the transistor chain) be in a wide range of 0.01 to 0.99. When the voltage Vout becomes equal to a potential at the input terminal 12, the differential amplifying circuit 11 stops its amplifying operation and goes into a stable state, so that an electric current flowing from the differential amplifying circuit 11 into the current control circuit 17 decreases, whereby a stable state is established.

Figure 5:
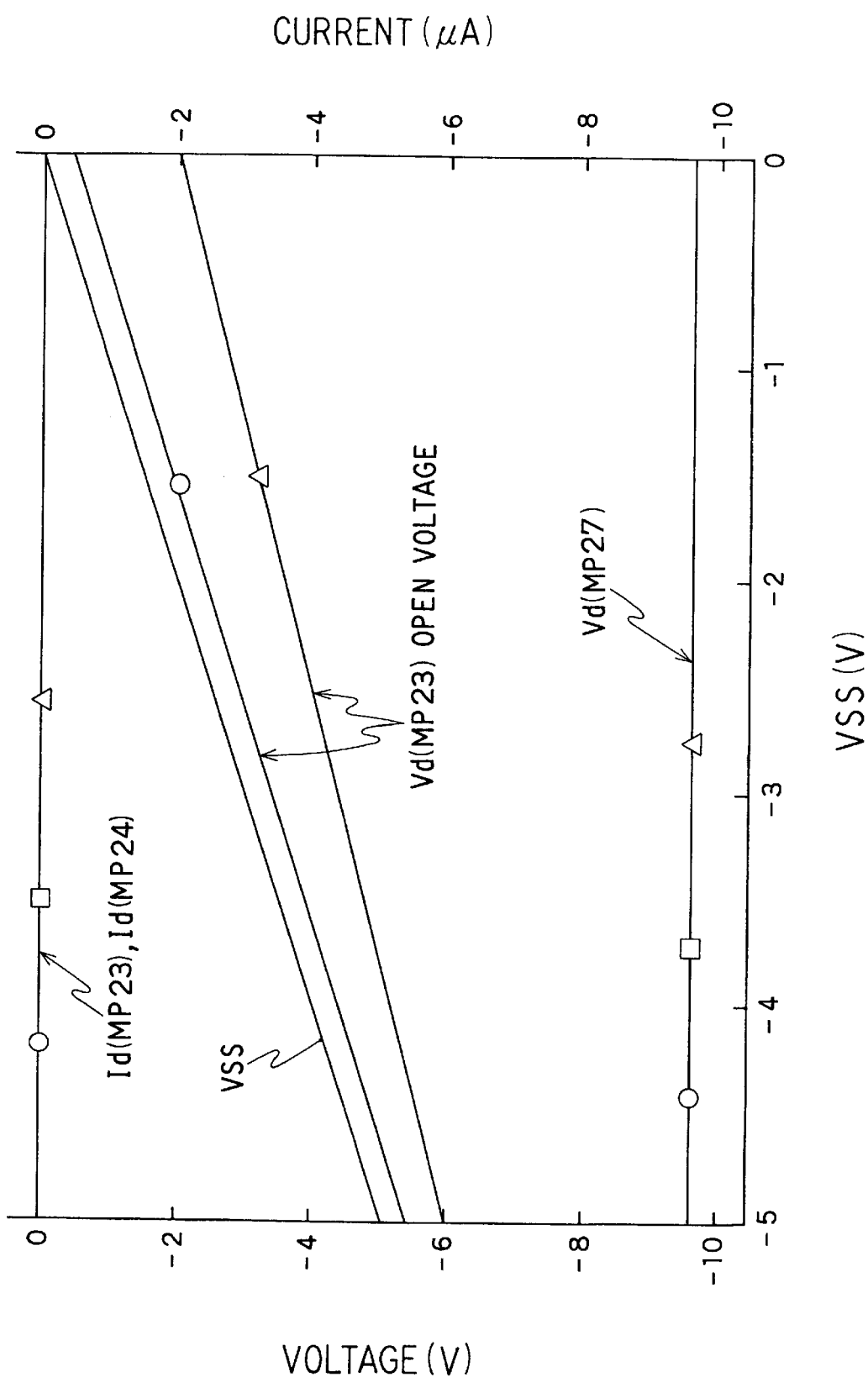
FIG. 5 is a characteristic diagram showing results in the case where a size ratio of MP23 and MP24 of the current control circuit 17 contained in the driving circuit 10 shown in FIG. 2 is varied.

FIG. 5 is a diagram showing results of simulation exhibiting power source voltage dependency of an internal current and a internal voltage in the case where each size of MP23 and MP24 is varied in the current control circuit 17 wherein a ratio in size ratio W/L of MP23 and MP24 is allowed to vary in such that 0.2:1 (for line marked 'O'), 0.5:1 (for line marked 'Δ'), 1:1 (for line marked '☐'), VDD=0 V, and VSS=0 V to –5 V in which their voltages VSS are plotted as abscissa, and voltages in drain voltage as well as currents in drain current (the polarity of which has been inverted) as ordinates, respectively. In this case, drain voltage Vd (#) means a drain voltage of a transistor #, while drain current Id (#) means a drain current of a transistor #.

A drain current Id(MP23) of MP23 and a drain current Id(MP24) as well as a drain voltage Vd(MN27) vary scarcely due to a negative feedback operation. Furthermore, although an open drain voltage Vd(MP23) of MP23 in case of O (a open drain voltage means a voltage in the case where it is separated from the differential amplifying circuit 11) varies from –0.5 V to –5 V, scattering in Vd(MP23) does not cause variations of an operating point in a DC fashion as well as unstableness, as is apparent from the contents described in relation to FIG. 3.

Figure 6:
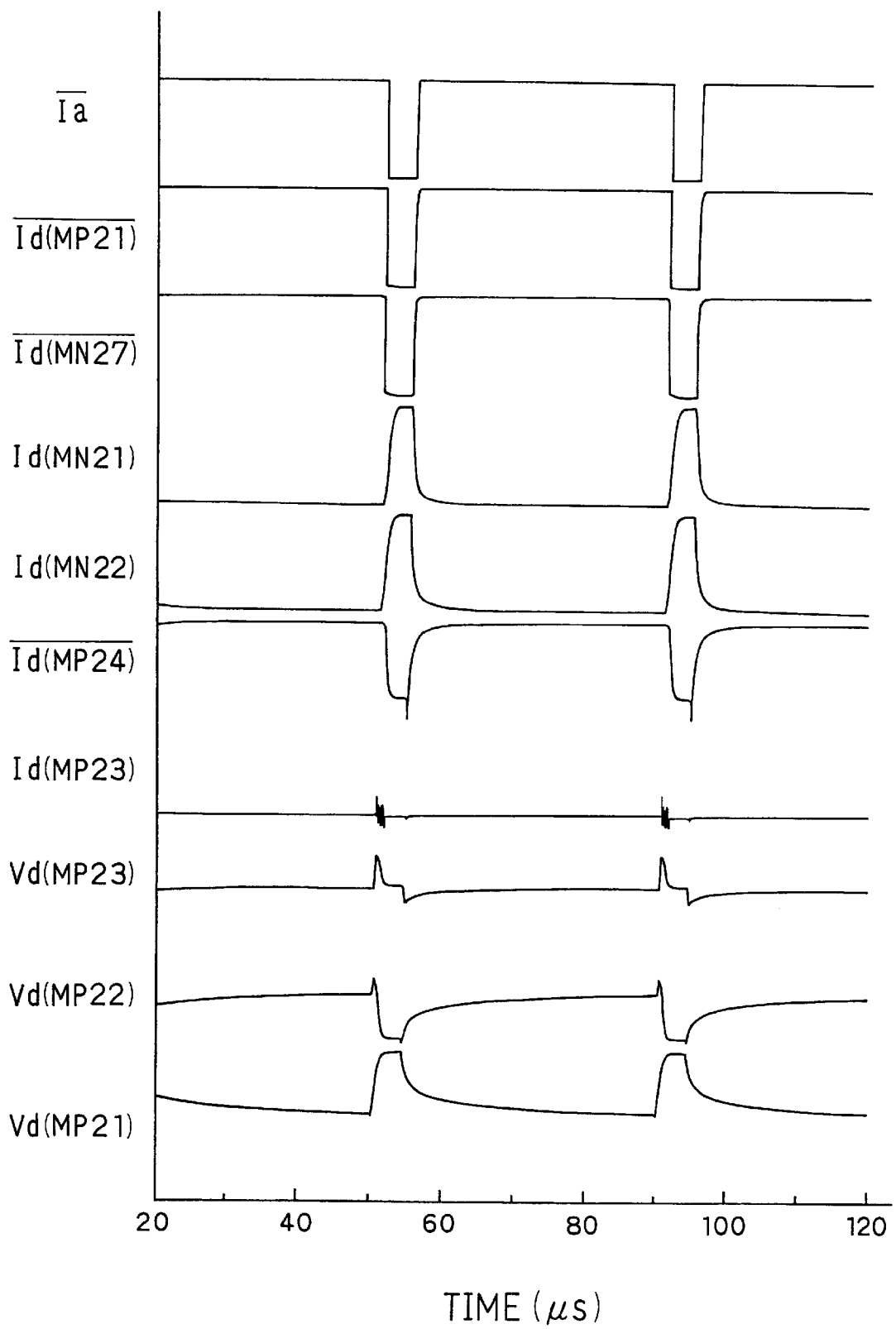
FIG. 6 is a simulation waveform diagram showing voltages and currents in respective sections in the case when a pulse current is injected to the current control circuit 17 contained in the driving circuit 10 shown in FIG. 2.

FIG. 6 is a waveform diagram showing current pulse response characteristics of the current control circuit 17 which is obtained by simulating internal current and potential in the case where the differential amplifying circuit 11 is separated, and a pulse current Ia being 2 μA and having 4 μs pulse width is injected to a source of MP21 from the outside. In this case, as to a waveform the polarity of which has been inverted, "–"(bar) is applied over a symbol of the corresponding voltage or electric current. When a pulse current of 2 μA is injected, a pulse current of about 2 μA flows through MP21, MN27, and MN21, an electric current being in response to a size ratio of MN21 and MN22 flows through MN22, and the same electric current as that flowing through MN22 flows through MP24. Although an electric current being in response to a size ratio of MP24 and MP23 flows through MP23, it makes possible to reduce the electric current by reducing the size ratio thereof as described above. Accordingly, there is no case where such electric current increases more and more as a result of circulation of the electric current from MP23 to MP21. Thus, a stable operation is achieved even when a pulse current was injected, and it becomes stable from the viewpoint of a DC fashion and pulse response.

EMBODIMENT 2

Figure 7:
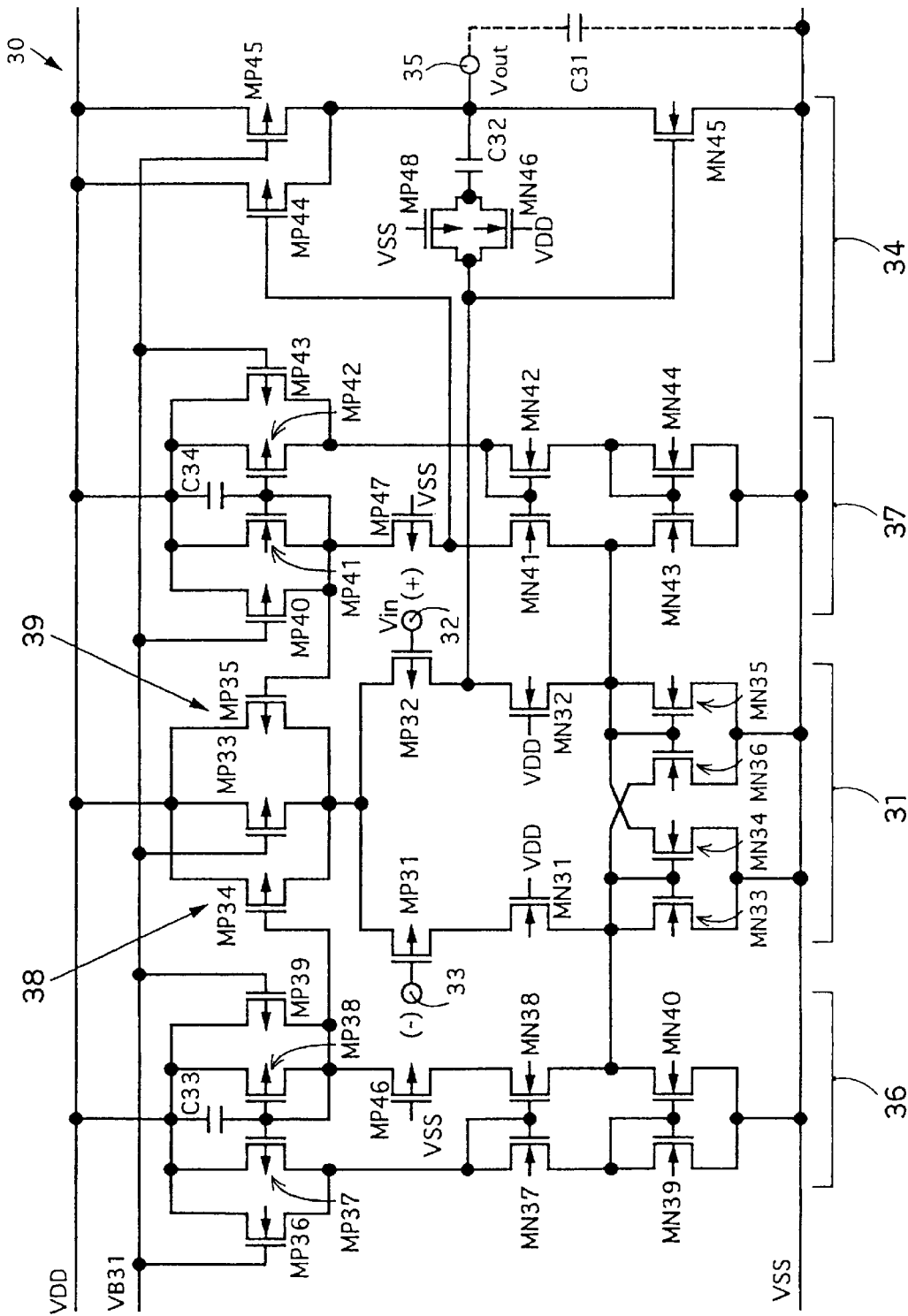
FIG. 7 is a circuit diagram showing a driving circuit 30 according to a second embodiment of the present invention.

FIG. 7 is a circuit diagram showing a driving circuit 30 according to a second embodiment of the invention wherein each polarity of the transistors contained in the driving circuit 10 shown in FIG. 2 is inverted, and reference characters MP31 through MP48 designate PMOS transistors, MN31 through MN46 NMOS transistors, C31 a capacitive load, C32 a phase compensating capacitor, C33 and C34 oscillation preventing capacitors, 31 a differential amplifying circuit, 32 a noninverting input terminal, 33 an inverting input terminal, 34 an output circuit, 35 an output terminal, 36 and 37 current control circuits, and 38 and 39 bias circuits, respectively.

Figure 8:
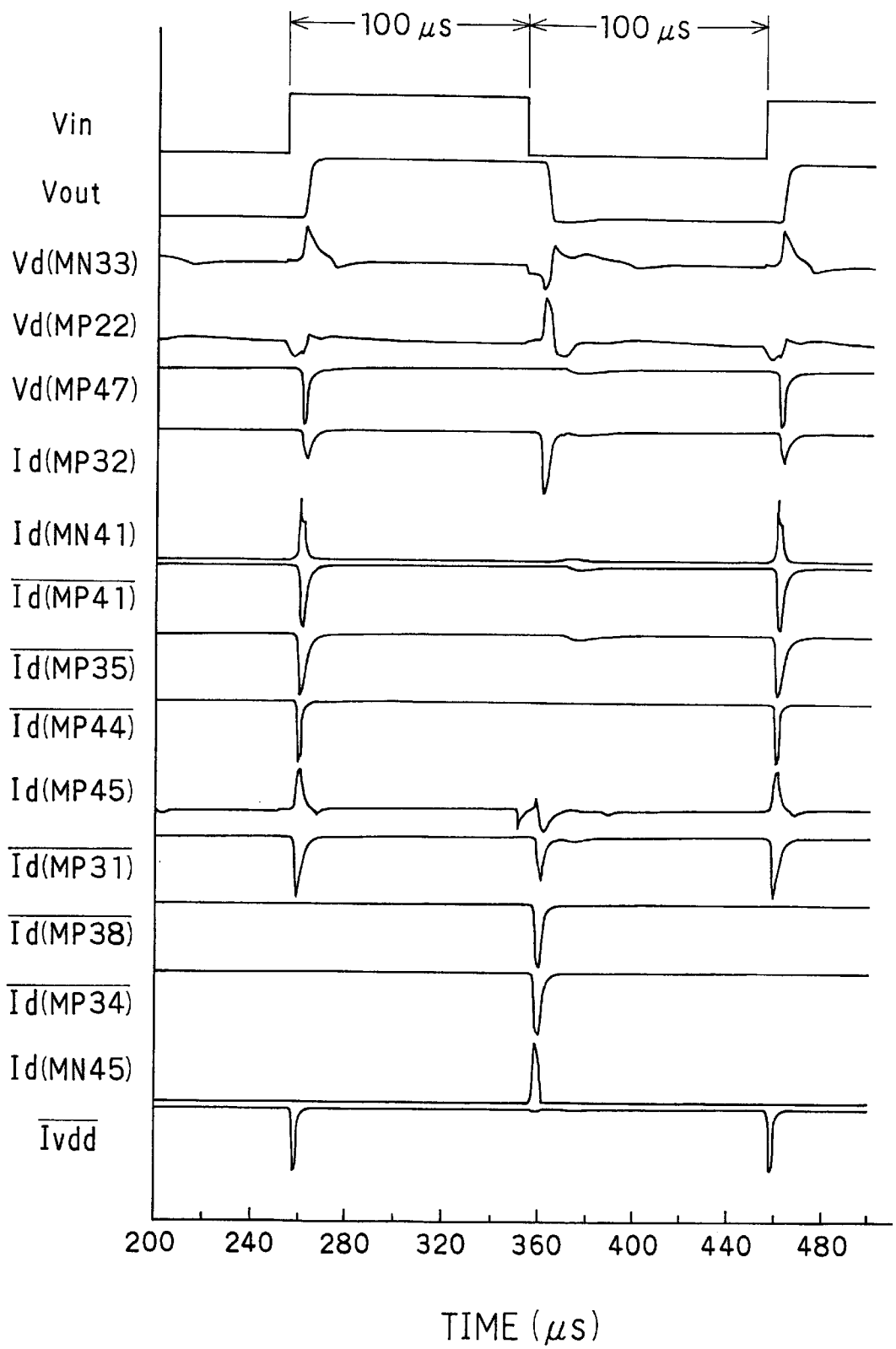
FIG. 8 is a simulation waveform diagram showing currents and voltages in respective sections of the driving circuit 30 shown in FIG. 7.

FIG. 8 is a waveform diagram showing operations in respective sections of the driving circuit 30 in the case where an input signal is applied to the noninverting input terminal 32 of the differential amplifying circuit 31, and the inverting input terminal 33 is connected commonly with the output terminal 35 to form a voltage follower circuit. In this case, as to a waveform the polarity of which has been inverted, "–" (bar) is applied over a symbol of the corresponding voltage or electric current.

When a voltage at the noninverting input terminal 32 changes from a low potential to a high potential, the differential amplifying circuit 31 and the current control circuit 37 are principally concerned with an operation of the driving circuit. In this case, since a drain current of MP32 decreases and a drain current of MP31 increases, a drain current in response to an increased drain current in MN33 is absorbed by MN34 from a source of MN41 in the current control circuit 37, and the current flows into MP41 through MP47. As a result, an electric current being proportional to each size ratio of the transistors MP35 and MP41 flows into MP35 connected with MP41 in a current mirror fashion to increase an operating current of the differential amplifying circuit 31. Moreover, as a result of increase in the drain current of MP47 in this occasion, remarkable voltage drop occurs in MP47 to decrease its drain voltage, whereby a gate voltage of MP44 is decreased, so that an output voltage Vout rises. In this occasion, negative feedback having a predetermined value or less is applied by an electric current flowing through MP41 from MP42 which is connected therewith in a current mirror fashion to MN42, MN44, and MN43, whereby occurrence of an unstable condition as a result of increase in a source current in MN41 is prevented. The circuit operates stably under a coefficient of the negative feedback be in a wide range of 0.01 to 0.99 as in the case of the driving circuit 10 shown in FIG. 2.

It has been confirmed that the driving circuit operates stably under an amount of positive feedback up to around 10 as in the case of the driving circuit 10 shown in FIG. 2. In addition, the driving circuit operates stably in the case when a size ratio of MP41 and MP35 is up to 10. When the output voltage Vout comes to be equal to a voltage at the noninverting input terminal 32, an amplifying operation in the differential amplifying circuit 31 is terminated, and a stable state is established.

Next, when a voltage at the noninverting input terminal 32 changes from a high potential to a low potential, the differential amplifying circuit 31 and the current control circuit 36 are principally concerned with an operation of the driving circuit. In this case, a drain current of MP32 increases, a drain current of MP31 decreases, and a source current of MN38 in the current control circuit 36 is absorbed by MN36. The drain current in MN38 flows into MP46 and MP38 to increase a drain current in MP34 connected with MP38 in a current mirror fashion, whereby an operating current of the differential amplifying circuit 31 is increased. Moreover, as a result of increase in the drain current of MP32 in this occasion, a gate voltage in MN45 is elevated, whereby an output voltage Vout at the output terminal 35 is decreased. In this occasion, negative feedback having a coefficient of predetermined value or less is applied by an electric current flowing through MP38 to MP37 which is connected with MP38 in a current mirror fashion, MN37, MN39, and MN40, whereby occurrence of an unstable condition as a result of increase in a source current in MN38 is prevented. A coefficient of the negative feedback is stable over a wide range of 0.01 to 0.99 as in the case of the driving circuit 10 shown in FIG. 2.

It has been confirmed that an amount of positive feedback is stable up to around 10 as in the case of the driving circuit 10 shown in FIG. 2. In addition, the driving circuit operates stably in the case when a size ratio of MP38 and MP34 is up to 10. When the output voltage Vout comes to be equal to a voltage at the noninverting input terminal 32, an amplifying operation in the differential amplifying circuit 31 is terminated, and a stable state is established.

Figure 9:
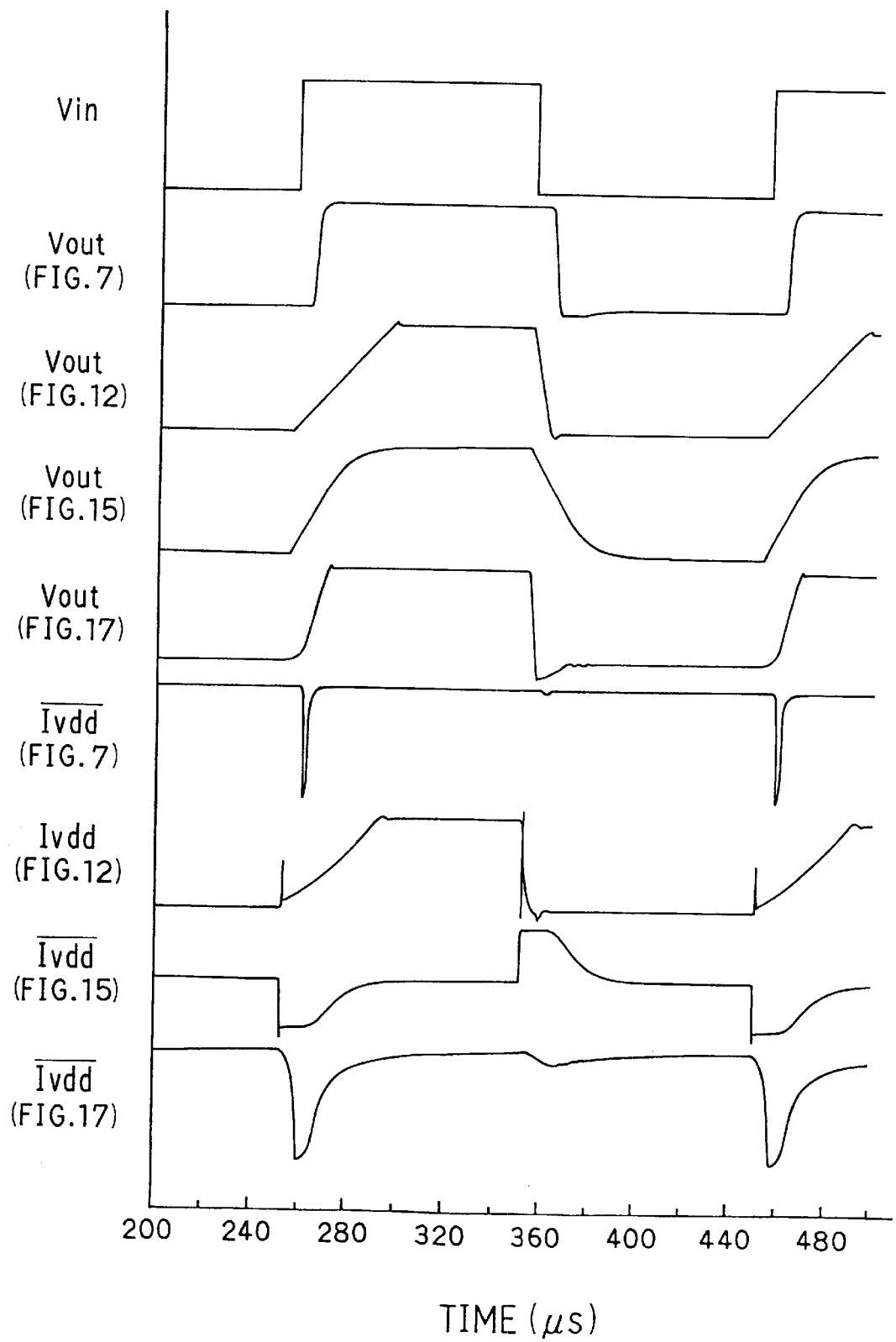
FIG. 9 is simulation waveform diagram showing a current and voltage of the driving circuit 30 shown in FIG. 7 in comparison with conventional circuits 100, 140 and 160, respectively.
Figure 12:
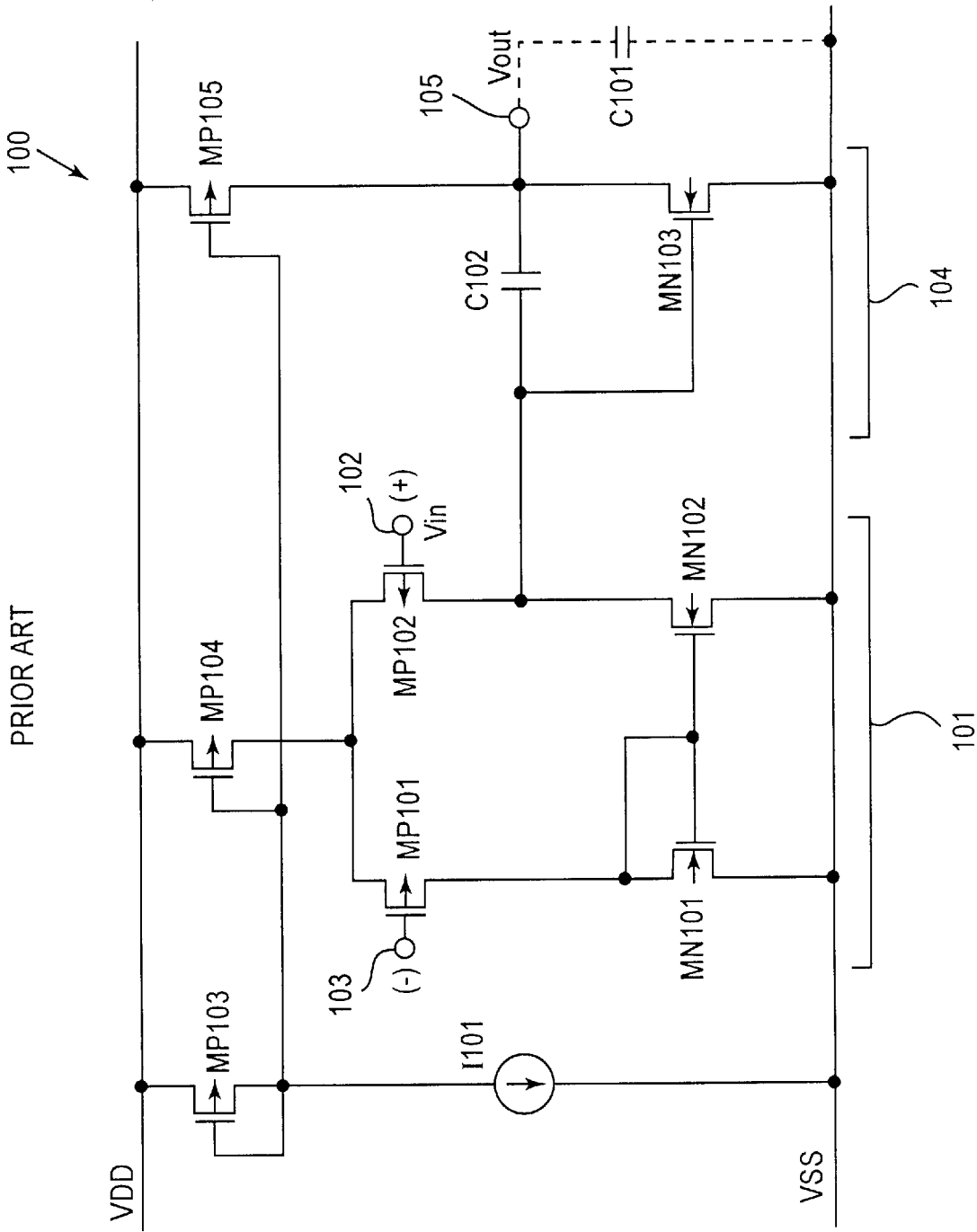
FIG. 12 is a circuit diagram showing a conventional driving circuit 100.
Figure 13:
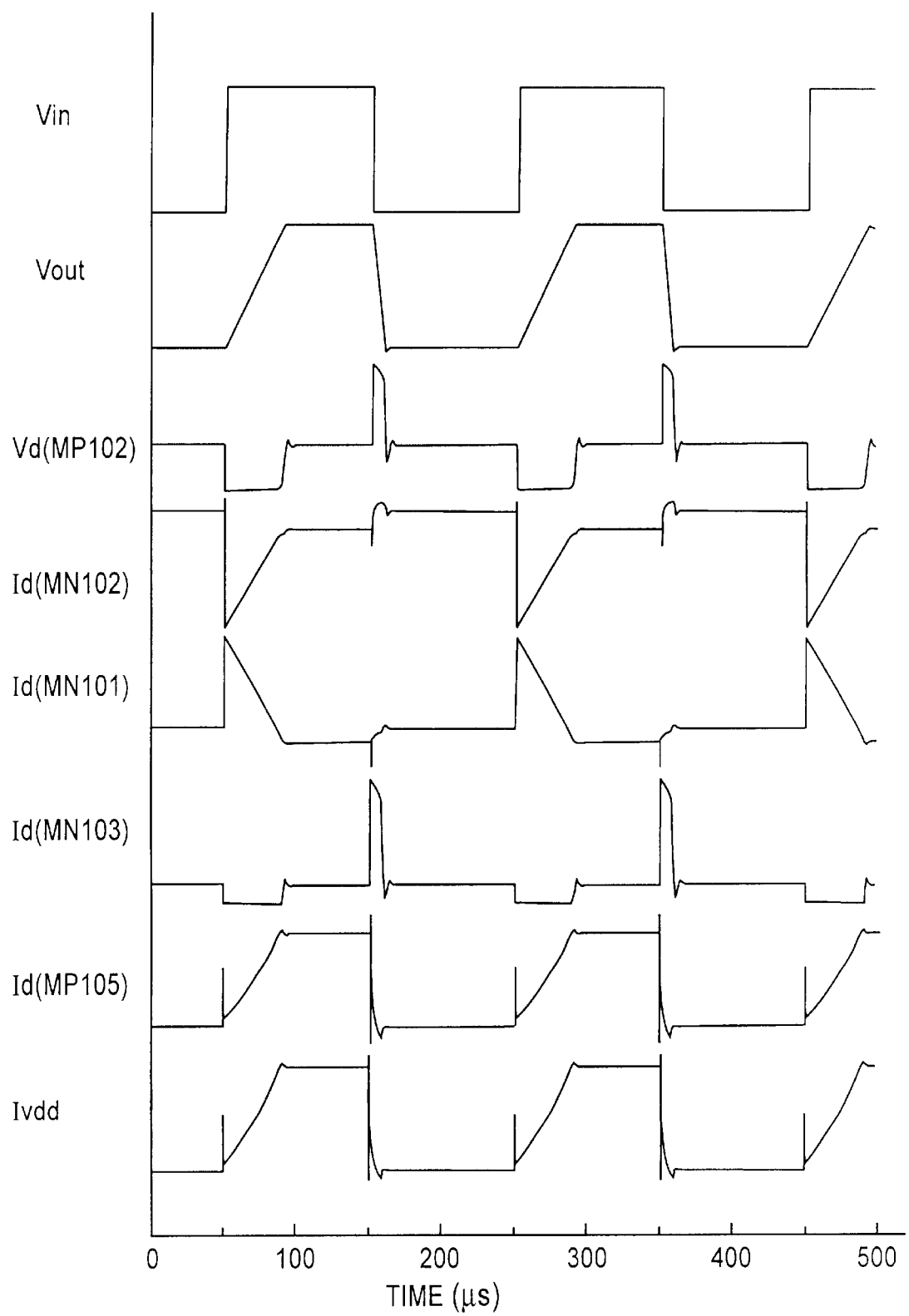
FIG. 13 is a simulation waveform diagram showing currents and voltages in respective sections of the driving circuit 100 shown in FIG. 12.
Figure 14:
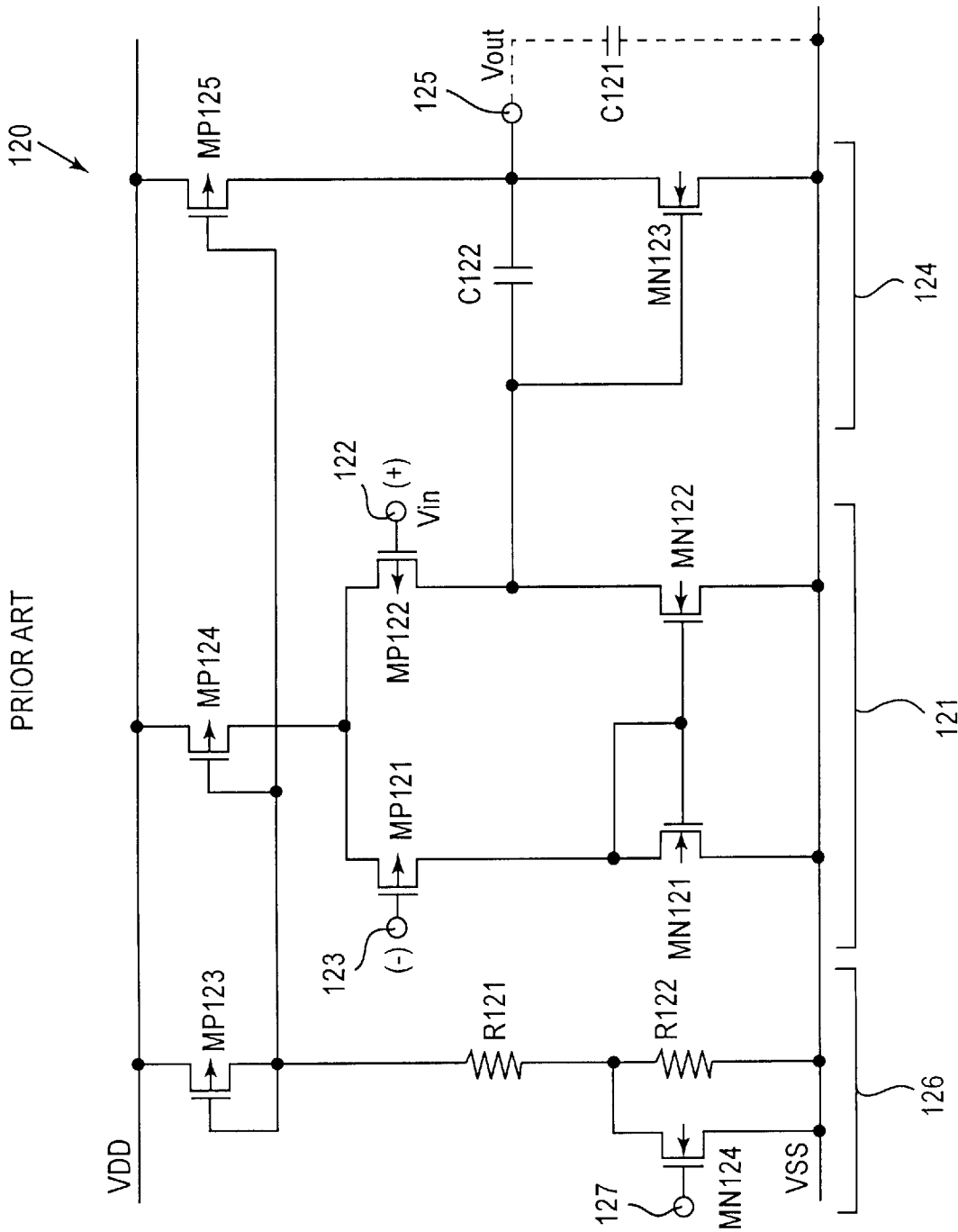
FIG. 14 is a circuit diagram showing a conventional driving circuit 120.
Figure 15:
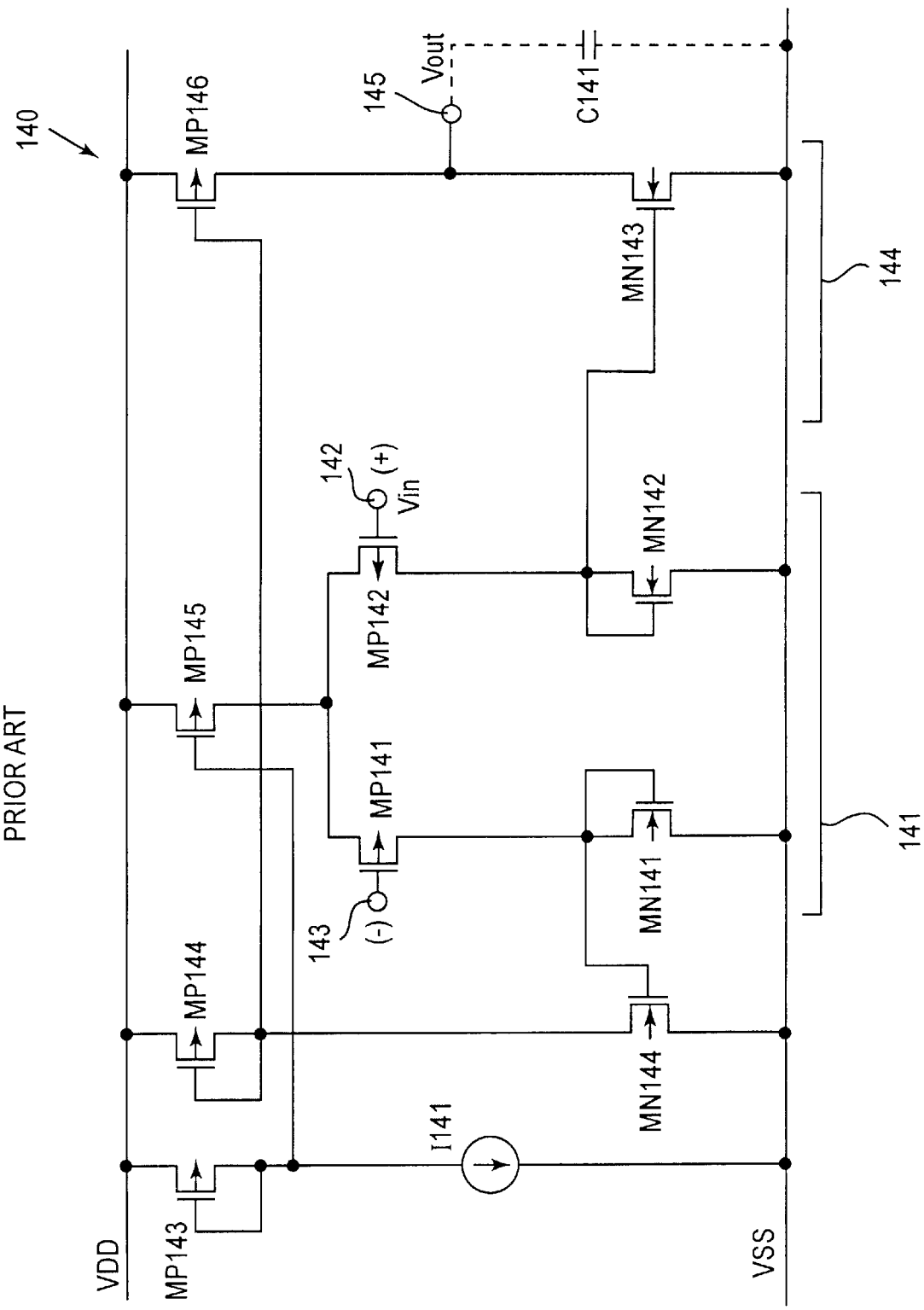
FIG. 15 is a circuit diagram showing a conventional driving circuit 140.
Figure 16:
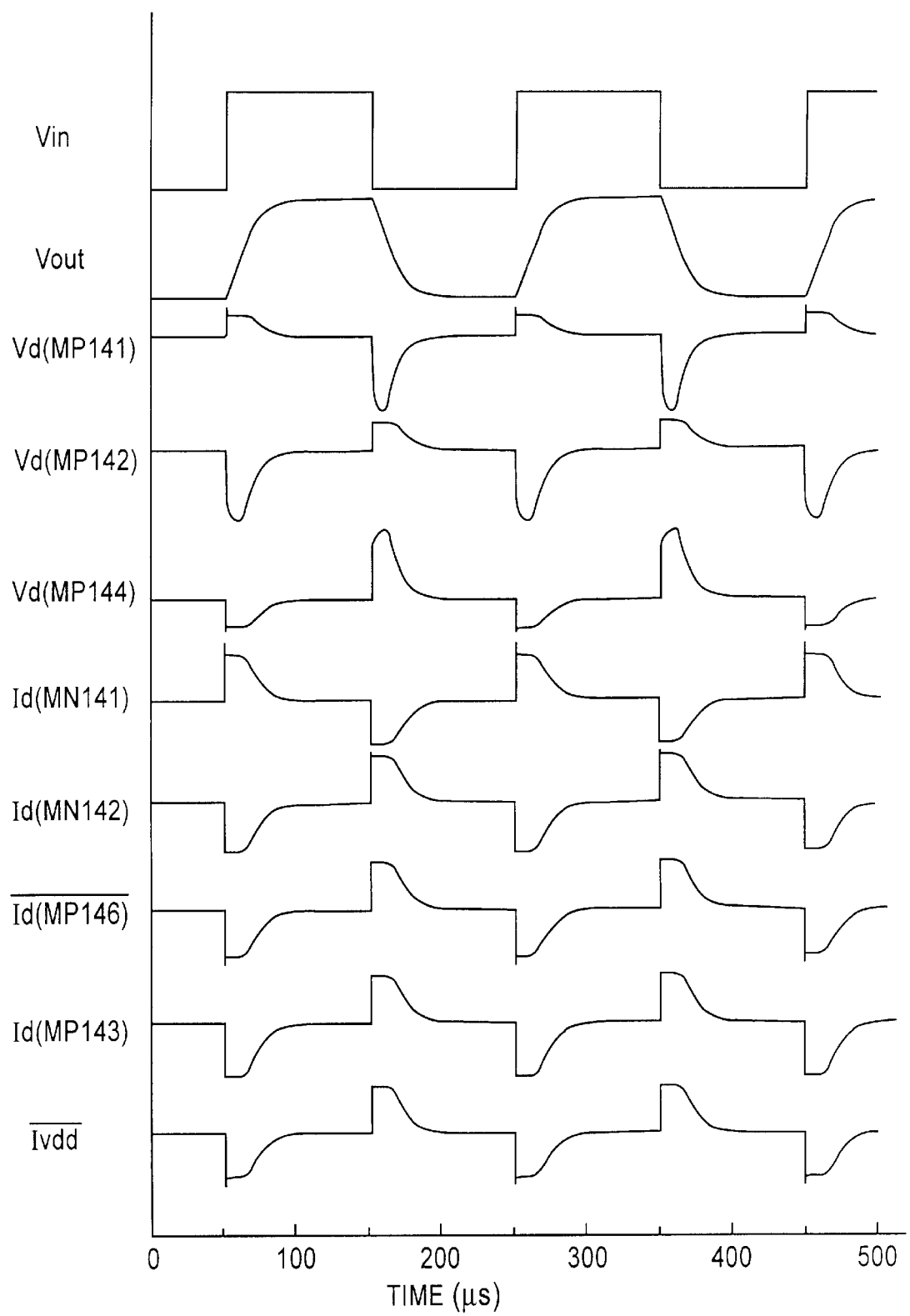
FIG. 16 is a simulation waveform diagram showing currents and voltages in respective sections of the driving circuit 140 shown in FIG. 15.
Figure 17:
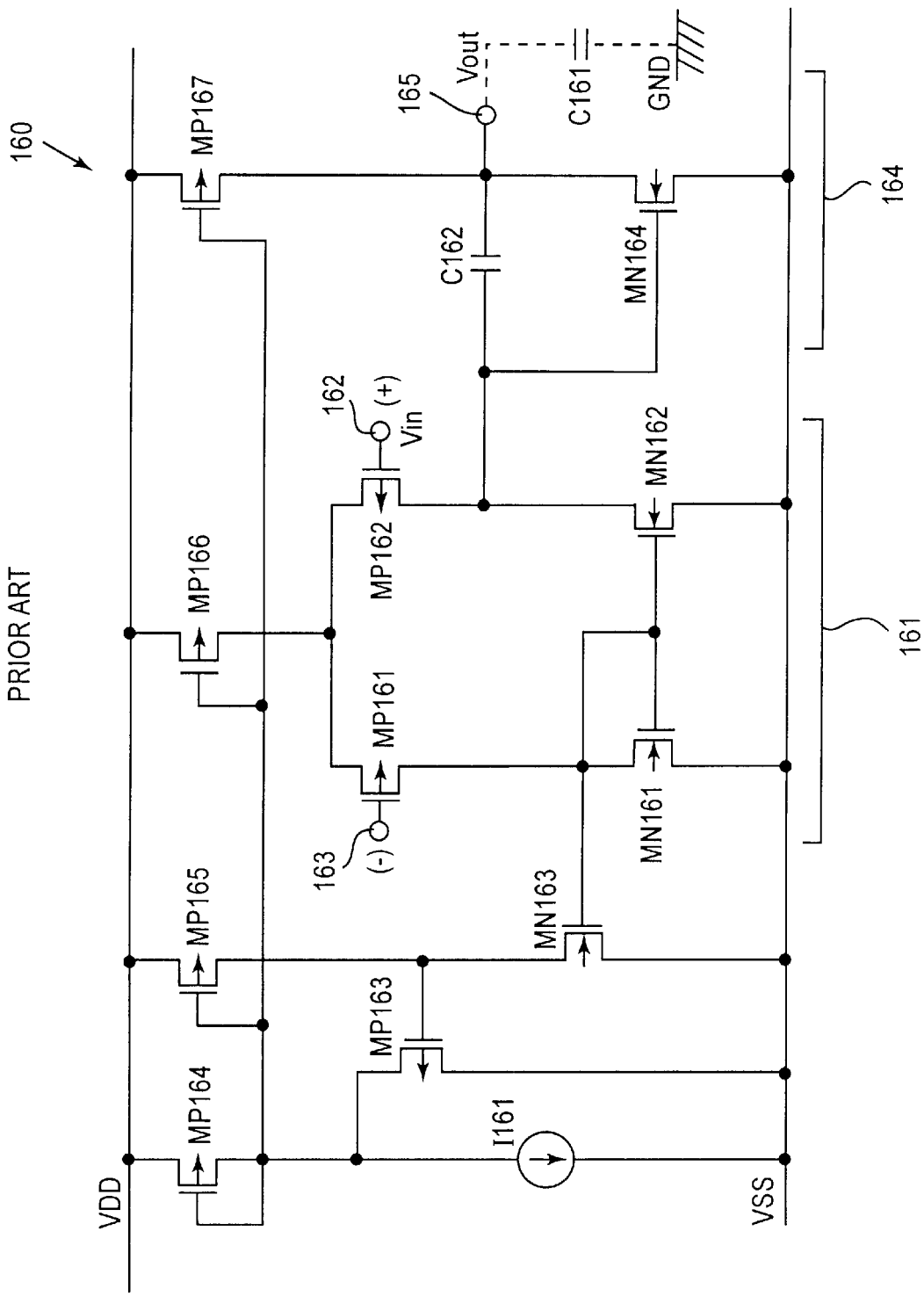
FIG. 17 is a circuit diagram showing a conventional driving circuit 160.
Figure 18:
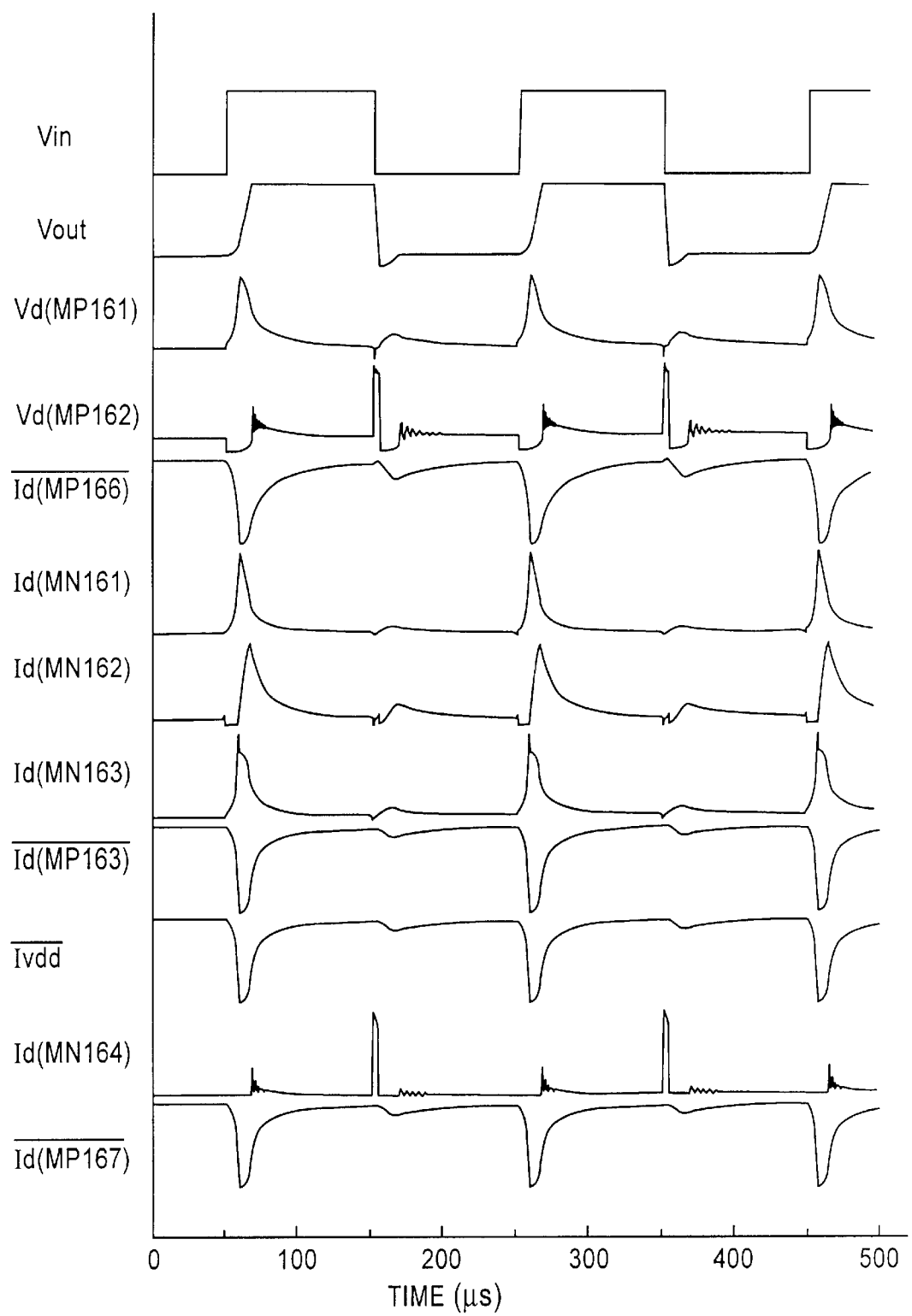
FIG. 18 is a simulation waveform diagram showing currents and voltages in respective sections of the driving circuit 160 shown in FIG. 17.
Figure 19:
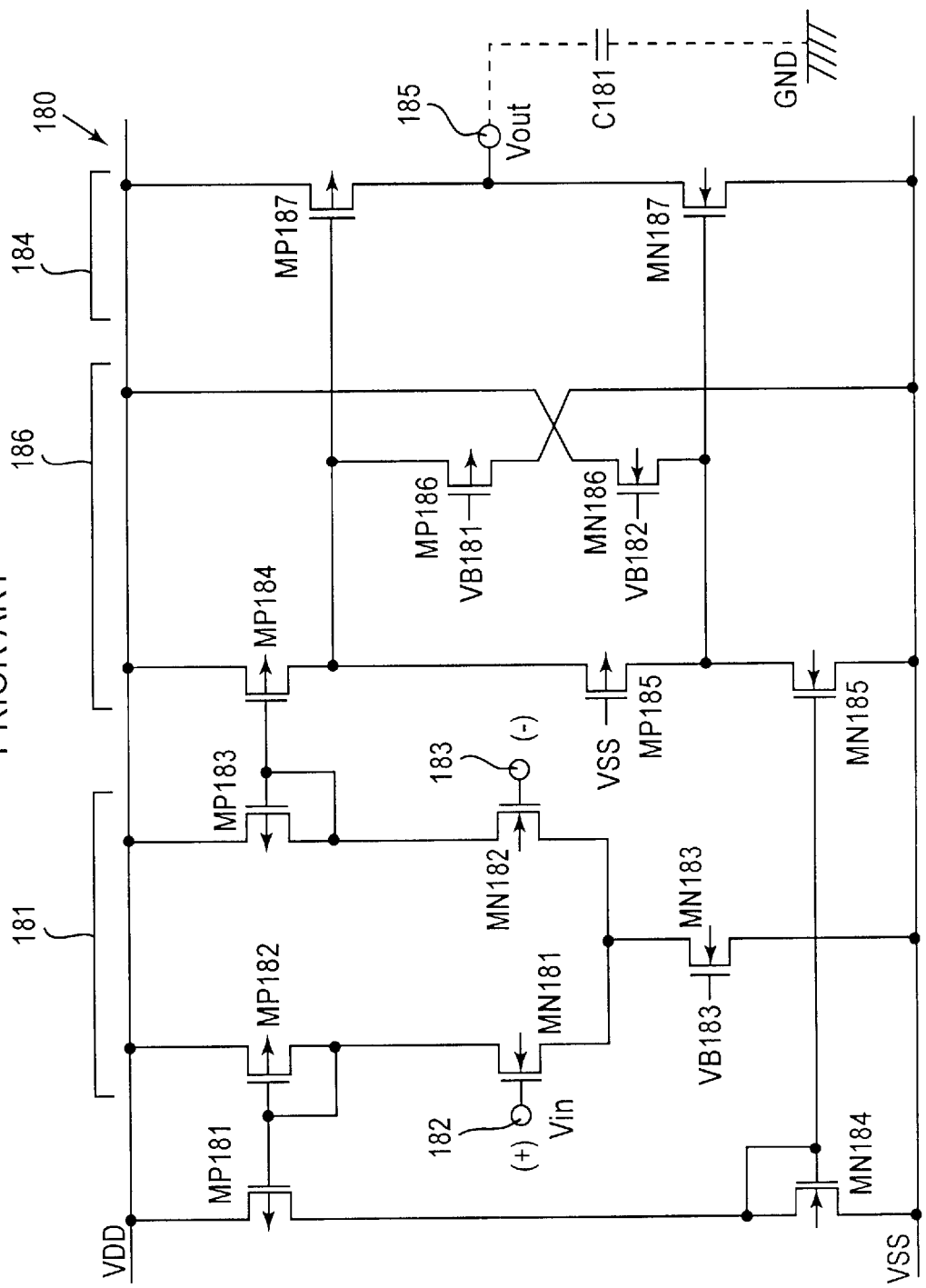
FIG. 19 is a circuit diagram showing a conventional driving circuit 180.
Figure 20:
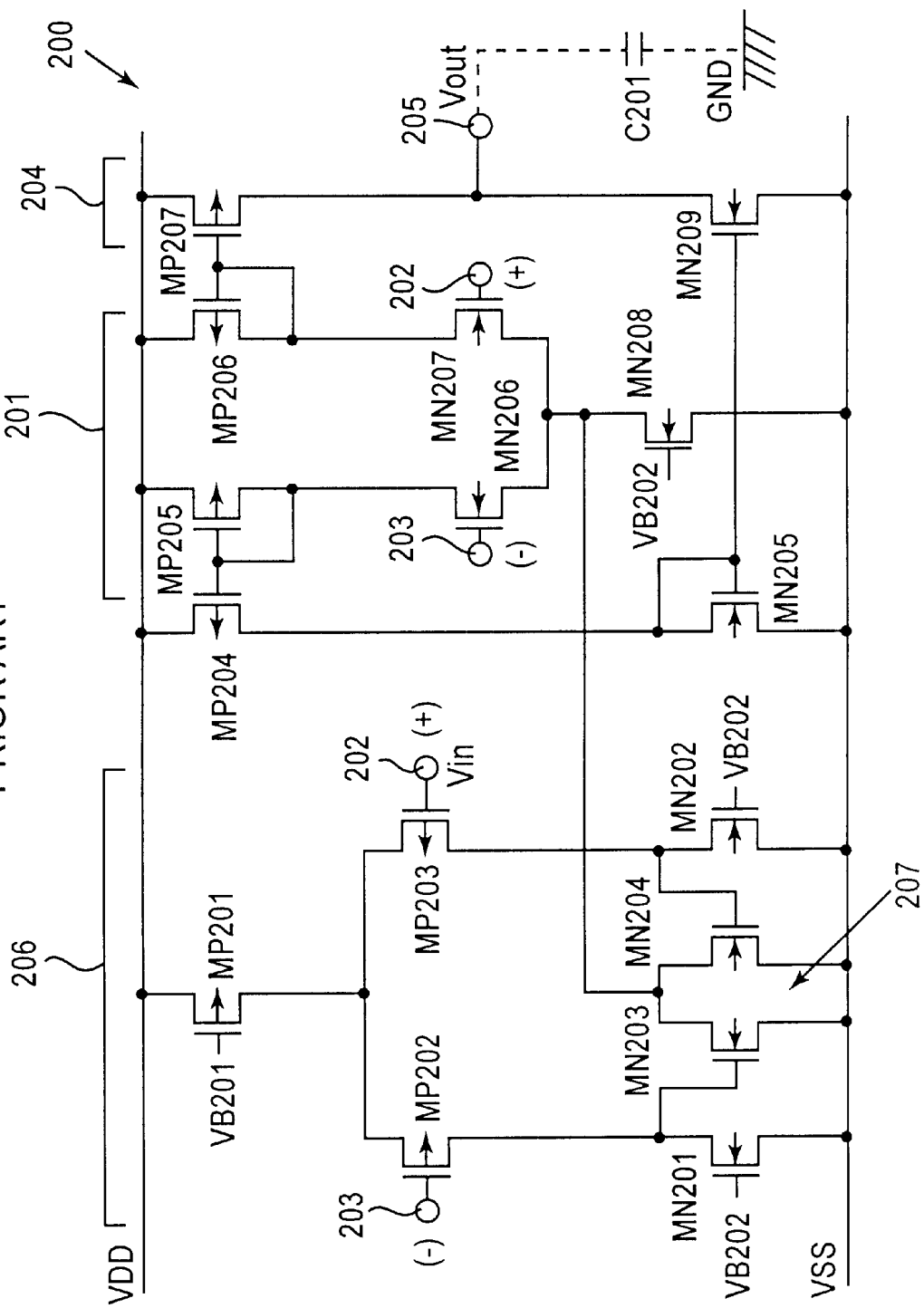
FIG. 20 is a circuit diagram showing a conventional driving circuit 200.
Figure 21:
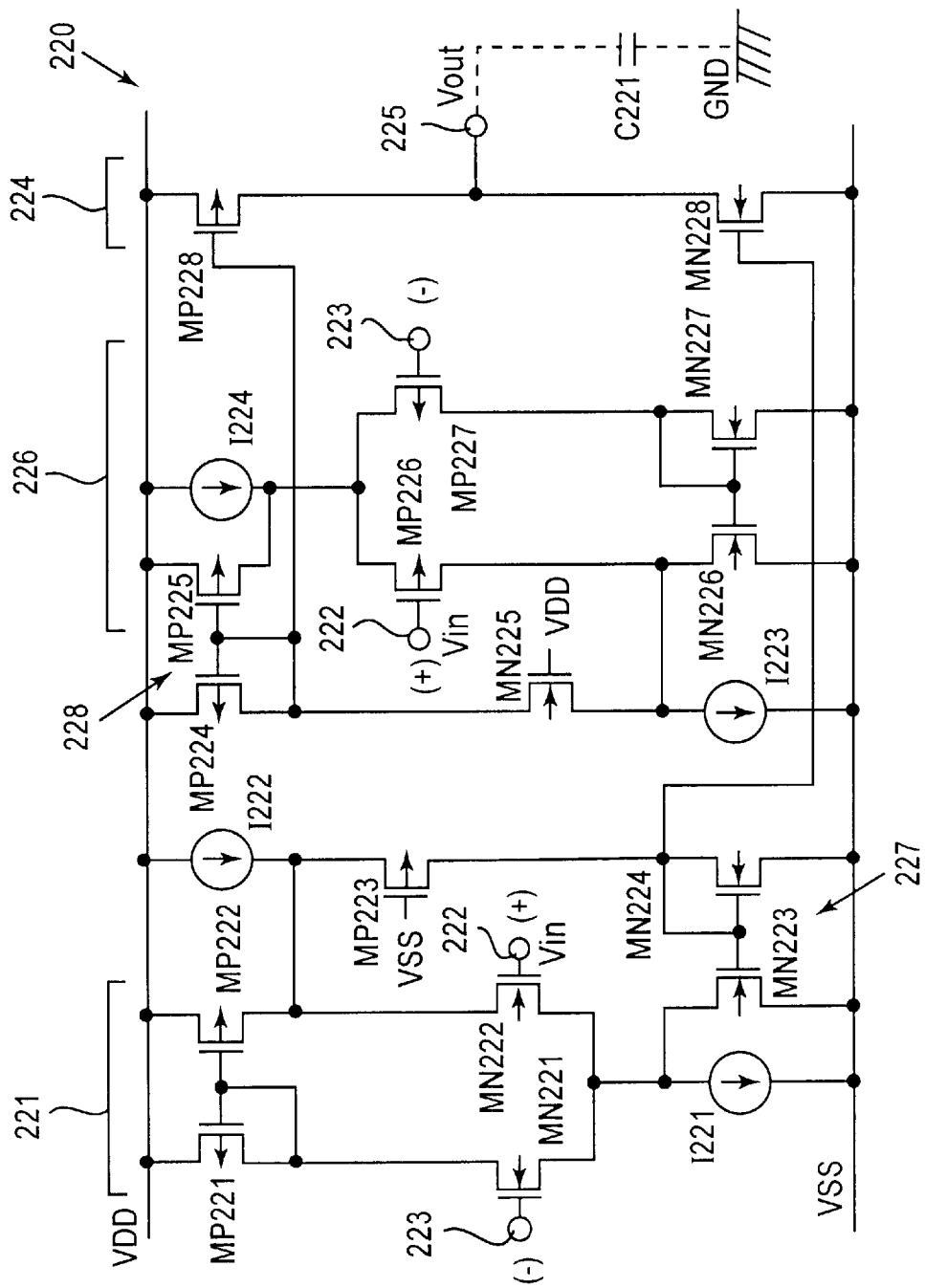
FIG. 21 is a circuit diagram showing a conventional driving circuit 220.

FIG. 9 is a comparative waveform diagram showing characteristics of each output voltage Vout and each current consumption Ivdd with respect to each input signal Vin in the driving circuit 30 of FIG. 7, the conventional driving circuit 100 of FIG. 12, the conventional driving circuit 140 of FIG. 15, and the conventional driving circuit 160 of FIG. 17 wherein each circuit connection is a voltage follower constitution, each capacitive load is 10,000 pF, VDD=0 V, VSS=−10 V, each input signal Vin is −3 V in high level, while −4 V in low level, each cycle is 200 μs, and each duty is 50%, respectively. In this situation, as to a waveform the polarity of which has been inverted, "−" (bar) is applied over a symbol of the corresponding voltage or electric current.

It has been found that in case of the driving circuit 30 (FIG. 7) according to the present embodiment, it is excellent in leading edge (slew rate) of the output voltage Vout, and a large current flows in only the case where the input voltage Vin varies in view of current consumption, so that a total power consumption comes to be extremely small as compared with that of other driving circuits.

EMBODIMENT 3

Figure 10:
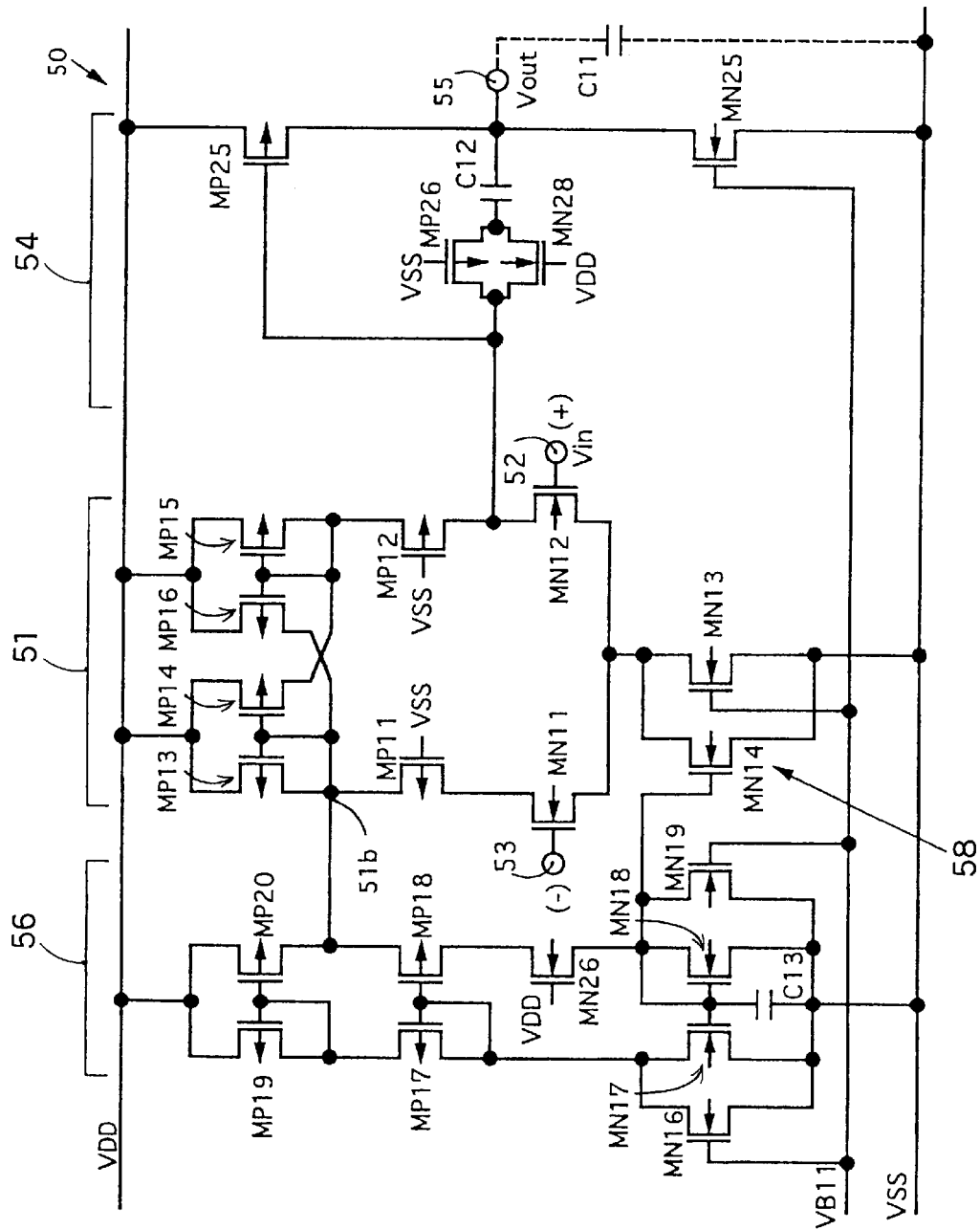
FIG. 10 is a circuit diagram showing a driving circuit 50 according to a third embodiment of the present invention.

FIG. 10 is a circuit diagram showing a driving circuit 50 according to a third embodiment of the invention and which corresponds to the contents described in respect of FIG. 1(b). In the driving circuit 50, reference numeral 51 denotes a differential amplifying circuit, 52 a noninverting input terminal, 53 an inverting input terminal, 54 an output driving circuit, and 55 an output terminal, respectively. The constitution of the driving circuit 50 corresponds to that of the driving circuit 10 shown in FIG. 2 from which have been removed the current control circuit 17 and the bias circuit 19 wherein a constitution of the output circuit 54 corresponds to that of the output circuit 14 of FIG. 2 from which has been removed MN24. In FIG. 10, the same parts, e.g., the transistors, capacitors and the like as those of FIG. 2 are designated by the same reference characters in FIG. 2.

In the driving circuit 50 according to the present embodiment, when an input voltage Vin at the noninverting input terminal 52 changes from a low potential to a high potential, a positive feedback operation wherein an electric current is injected from MP16 to the current control circuit 56 to increase a drain current of MN14 in the bias circuit 58, whereby an operating current is increased as well as a negative feedback operation wherein such operating current is allowed to flow tentatively are applied. In this case, a gate voltage at MP25 decreases to elevate an output voltage Vout.

On the contrary, when the input voltage Vin at the noninverting input terminal 52 changes from a high potential to a low potential, the drain voltage in MN12 becomes high, so that the gate potential in MP25 is elevated, whereby the output voltage Vout decreases.

EMBODIMENT 4

Figure 11:
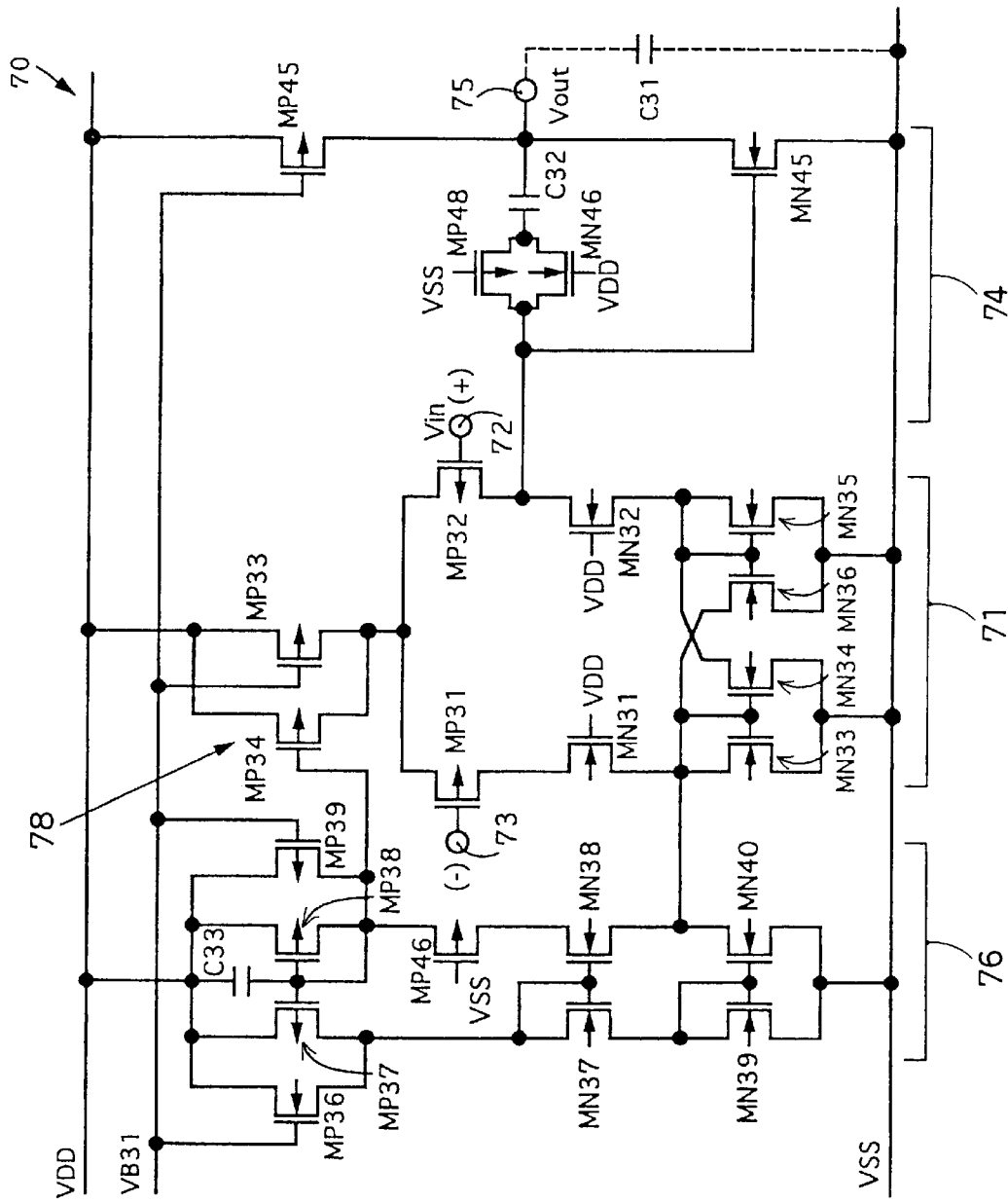
FIG. 11 is a circuit diagram showing a driving circuit 70 according to a forth embodiment of the present invention.

FIG. 11 is a circuit diagram showing a driving circuit 70 according to a forth embodiment of the invention wherein reference numeral 71 designates a differential amplifying circuit, 72 a noninverting input terminal, 73 an inverting input terminal, 74 an output driving circuit, and 75 an output terminal, respectively. The constitution of the driving circuit 70 corresponds to that of the driving circuit 30 shown in FIG. 7 from which have been removed the current control circuit 37 and the bias circuit 39 wherein the constitution of the output circuit 74 corresponds to that of the output circuit 34 of FIG. 7 from which has been removed MP44. In FIG. 11, the same parts, e.g., the transistors, capacitors and the like as those of FIG. 7 are designated by the same reference characters in FIG. 7.

In the driving circuit 70 according to the present embodiment, when an input voltage Vin at the noninverting input terminal 72 changes from a high potential to a low potential, a positive feedback operation wherein an electric current is absorbed from the current control circuit 76 by means of MN36, so that a drain current at MP34 in the bias circuit 78 is increased, whereby an operating current in the differential amplifying circuit 71 increases as well as a negative feedback operation wherein such operating current is allowed to flow tentatively are applied. In this case, a gate voltage at MN45 increases to lower an output voltage Vout.

On the contrary, when the input voltage Vin at the noninverting input terminal 72 changes from a low potential to a high potential, the drain voltage in MN32 becomes low, so that the gate potential in MN45 is reduced, whereby the output voltage Vout increases.

As is clear from the above description, according to a driving circuit of the present invention, when an input varies, such positive feedback that an operating current in a differential amplifying circuit is increased by a current control circuit is applied thereby to speed up the operation, so that its slew rate increases, while in the current control circuit, since negative feedback is simultaneously applied, the positive feedback is immediately terminated, and as a result, the operation does not become unstable. On one hand, in also an output circuit, a driving force can be increased when an input varies, so that its operation is sped up, and a slew rate herein becomes also high.

Moreover, a driving current and an operating current increases for only a short period of time where an input varies, and only a small idling current is required in a steady state, so that the driving circuit can be sufficiently driven even if a load is significant, besides current consumption is slight. Particularly, with respect to idling current, it is scarcely consumed in the current control circuit, and hence, the idling current can be reduced by two digit or more in comparison with that of a conventional example as the whole circuits.

Furthermore, in the present invention, a size and size ratio of transistors contained in a positive feedback path and determining an amount of the positive feedback has a considerable degree of freedom with respect to both its relative precision and absolute precision over a wide range, so that they are operated stably even if there is some scattering as to each element in its size and parameter, whereby its design becomes easy and an yield thereof is also elevated in manufacturing.

In addition, since remarkable flexibility is in an operating point, its design is easy in view of this, and thus prompt compliance can be possible with respect to a target specification.

It is further understood by those skilled in the art that the foregoing description is a preferred embodiment of the disclosed circuit and that various changes and modifications may be made in the invention without departing from the spirit and scope thereof.

What is claimed is:

1. A driving circuit comprising,
   a differential amplifying circuit,
   an output circuit driven by an output signal of the differential amplifying circuit; and
   a current control circuit for applying a positive feedback in such that an increased current signal of an operating current on a noninverting side or an operating current on an inverting side of the differential amplifying circuit is injected to increase an operating current of the differential amplifying circuit;
   wherein a negative feedback implemented by a recirculating transistor chain having a recirculating gain of less-than 1 for decreasing the increased current signal thus injected is applied to the aforesaid current control circuit,
   wherein the aforesaid differential amplifying circuit is provided with a first current mirror circuit for supplying an electric current corresponding to an operating current on the noninverting side to an output section on the inverting side,
   and a second current mirror circuit for supplying an electric current corresponding to an operating current on the inverting side to an output section on the noninverting side;
   wherein an increased variation signal of either of the electric current supplied by the first current mirror circuit or the electric current supplied by the second current mirror circuit is injected to the aforesaid current control circuit as the aforesaid increased current signal.

2. The driving circuit of claim 1,
   wherein a biasing current mirror circuit to add a current being proportional to the aforesaid increased current signal to the operating current of the aforesaid differential amplifying circuit, and a group of negative feedback current mirror circuits which is allowed to decrease the aforesaid increased current signal injected to the current control circuit are provided.

3. The driving circuit of claim 1, wherein the aforesaid current control circuit is provided with a delay capacitor charged by the aforesaid increased current signal thus injected.

4. The driving circuit of claim 2, wherein the aforesaid biasing current mirror circuit is provided with a delay capacitor charged by the aforesaid increased current signal thus injected.

5. A driving circuit comprising,
   a differential amplifying circuit,
   an output circuit driven by an output signal of the differential amplifying circuit; and
   a current control circuit for applying a positive feedback in such that an increased current signal of an operating current on a noninverting side or an operating current on an inverting side of the differential amplifying circuit is injected to increase an operating current of the differential amplifying circuit;
   wherein a negative feedback implemented by a recirculating transistor chain having a recirculating gain of less than 1 for decreasing the increased current signal thus injected is applied to the aforesaid current control circuit,
   wherein a biasing current mirror circuit to add a current being proportional to the aforesaid increased current signal to the operating current of the aforesaid differential amplifying circuit, and a group of negative feedback current mirror circuits which is allowed to decrease the aforesaid increased current signal injected to the current control circuit are provided,
   wherein the aforesaid group of the negative feedback current mirror circuits is provided with a first current mirror circuit wherein the aforesaid increased current signal is injected to an output side thereof,
   a second current mirror circuit wherein an electric current on the output side of the first current mirror circuit flows in a reference side thereof, while an electric current on its output side flows in the reference side of the aforesaid first current mirror circuit,
   and a third current mirror circuit wherein an electric current on the reference side of the aforesaid first current mirror circuit flows in its reference side, while an electric current on its output side flows in the output side of the aforesaid first current mirror circuit;
   and each magnification of the aforesaid first, second, and third current mirror circuits is set to a predetermined value, whereby the aforesaid increased current signal thus injected is allowed to decrease.

6. A driving circuit comprising,
   a differential amplifying circuit
   an output circuit driven by an output signal of the differential amplifying circuit; and
   a current control circuit for applying a positive feedback in such that an increased current signal of an operating current on a noninverting side or an operating current on an inverting side of the differential amplifying circuit is injected to increase an operating current of the differential amplifying circuit,
   wherein a negative feedback for decreasing the increased current signal thus injected is applied to aforesaid current control circuit,
   wherein a biasing current mirror circuit to add a current being proportional to the aforesaid increased current signal to the operating current of the aforesaid differential amplifying circuit, and a group of negative feedback current mirror circuits which is allowed to decrease the aforesaid increased current signal injected to the current control circuit are provided, wherein the aforesaid output circuit is constituted in such that a first transistor driven in response to an increased current signal of either of the operating current on the noninverting side or the operating current on the inverting side of the aforesaid differential amplifying circuit and a second transistor driven by a fixed bias voltage are connected serially between a high potential power source and a low potential power source, common connecting points of both the transistors are served for an output terminal, and a third transistor is connected in parallel to the aforesaid second transistor; and the current control circuit to which is injected the other increased current signal of the operating current on the noninverting side or the operating current on the inverting side of the aforesaid differential amplifying circuit is provided with a load resistance for converting the aforesaid increased current signal thus injected into a voltage; whereby the aforesaid third transistor is driven by the voltage produced in the load resistance.

\* \* \* \* \*